US012310244B2

(12) United States Patent
Farhangdoust et al.

(10) Patent No.: US 12,310,244 B2
(45) Date of Patent: May 20, 2025

(54) METAMATERIAL-BASED SUBSTRATE FOR PIEZOELECTRIC ENERGY HARVESTERS

(71) Applicant: The Boeing Company, Arlington, VA (US)

(72) Inventors: Saman Farhangdoust, Miami, FL (US); Gary E. Georgeson, Tacoma, WA (US); Jeong-Beom Ihn, Bellevue, WA (US)

(73) Assignee: THE BOEING COMPANY, Arlington, VA (US)

( * ) Notice: Subject to any disclaimer, the term of this patent is extended or adjusted under 35 U.S.C. 154(b) by 108 days.

(21) Appl. No.: 18/198,181

(22) Filed: May 16, 2023

(65) Prior Publication Data
US 2023/0292622 A1    Sep. 14, 2023

Related U.S. Application Data

(62) Division of application No. 16/907,192, filed on Jun. 20, 2020, now Pat. No. 11,700,773.

(51) Int. Cl.
*B60L 53/30*  (2019.01)
*B60L 53/66*  (2019.01)
(Continued)

(52) U.S. Cl.
CPC .............. *H10N 30/88* (2023.02); *B60L 53/30* (2019.02); *B60L 53/66* (2019.02); *B64D 43/00* (2013.01); *H02J 7/0042* (2013.01); *H02J 50/001* (2020.01); *H10N 30/302* (2023.02); *H10N 30/306* (2023.02); *B60L 2200/10* (2013.01); *H02J 2207/50* (2020.01); *H02J 2310/44* (2020.01)

(58) Field of Classification Search
CPC ...... B60L 53/30; B60L 53/66; B60L 2200/10; B60L 53/56; B64D 43/00; B64D 41/00; B64D 45/00; B64D 2045/0085; H02J 7/0042; H02J 50/001; H02J 2207/50; H02J 2310/44; H02J 50/005; H10N 30/302; H10N 30/306; H10N 30/304; Y02T 10/70; Y02T 10/7072; Y02T 50/50; Y02T 90/12; H02N 2/186
USPC .......... 307/104; 320/108; 343/700; 333/239; 340/539.22, 593.22, 539.26
See application file for complete search history.

(56) References Cited

U.S. PATENT DOCUMENTS

| | | | |
|---|---|---|---|
| 2010/0148519 A1* | 6/2010 | Shih ...................... | H10N 30/306 290/1 R |
| 2011/0199976 A1* | 8/2011 | Mitchell ................ | H01Q 1/007 370/328 |
| 2019/0232598 A1* | 8/2019 | Abbasi .................. | B31D 3/002 |

* cited by examiner

*Primary Examiner* — Elim Ortiz
(74) *Attorney, Agent, or Firm* — Moore IP Law

(57) ABSTRACT

A metamaterial-based substrate (meta-substrate) for piezoelectric energy harvesters. The design of the meta-substrate combines kirigami and auxetic topologies to create a high-performance platform including preferable mechanical properties of both metamaterial morphable structures. The creative design of the meta-substrate can improve strain-induced vibration applications in structural health monitoring, internet-of-things systems, micro-electromechanical systems, wireless sensor networks, vibration energy harvesters, and other applications whose efficiency is dependent on their deformation performance. The meta-substrate energy harvesting device includes a meta-material substrate comprising an auxetic frame having two kirigami cuts and a piezoelectric element adhered to the auxetic frame by means of a thin layer of elastic glue.

20 Claims, 21 Drawing Sheets

(51) Int. Cl.
  *B64D 43/00* (2006.01)
  *H02J 7/00* (2006.01)
  *H02J 50/00* (2016.01)
  *H10N 30/30* (2023.01)
  *H10N 30/88* (2023.01)

METAMATERIAL-BASED SUBSTRATE FOR PIEZOELECTRIC ENERGY HARVESTERS

RELATED PATENT APPLICATION

This application is a divisional of and claims domestic benefit from U.S. patent application Ser. No. 16/907,192 filed on Jun. 20, 2020.

BACKGROUND

This disclosure relates generally to energy harvesting systems and methods, and more particularly to piezoelectric devices for energy harvesting.

A piezoelectric energy harvester is able to harness strain energy of structures exposed to cyclic strains in which the vibration strain is the most abundant energy source. More specifically, a pair of oppositely polarized piezoelectric wafers deflect to produce an electrical current. Also a strain piezoelectric energy harvester does not need tuning techniques or inertia effects of any external mass for exacerbating the oscillation. However, low efficiency is the severe limitation for piezoelectric energy harvesters, especially for devices with a low-amplitude low-frequency excitation.

The efficiency of a piezoelectric energy harvester may be enhanced by applying the piezoelectric element on a substrate made of metamaterials. A metamaterial is a material engineered to have a property that is not found in naturally occurring materials. The materials are usually arranged in repeating patterns of microscale elements. Metamaterials derive their properties not from the properties of the base materials, but from their newly designed structures.

Auxetic materials have been used to enhance the efficiency of piezoelectric energy harvesters. Auxetic materials display a negative Poisson's ratio. The Poisson's ratio defines the ratio between two characteristics of lateral and axial strains of a structure. The value of Poisson's ratio is the negative of the ratio of lateral (transverse) strain to axial strain:

$$\vartheta = -\frac{\varepsilon_{lateral}}{\varepsilon_{Axial}}$$

Typically, materials have positive Poisson's ratio and contract in the orthogonal direction of applied force. However, this reaction is completely different for auxetic structures that exhibit counterintuitive behavior during deformation. The negative Poisson's ratio of the auxetic design enables structures to be expanded in both longitudinal and transverse directions easily. In recent years, in light of the success in power output enhancement based on materials having negative Poisson's ratio, the auxetic types of energy harvesters have gradually attracted attention.

Kirigami is another metamaterial that has been employed in energy harvesters. The kirigami metamaterial has been developed based on incised periodic and symmetric cuts which are applied to shells and plates to enrich the breaking strain and deformation capacity of the material. One team of investigators proved experimentally that a soft and highly deformable piezoelectric energy harvester with a kirigami-based substrate produced a 2.6 times improvement in voltage output compared to conventional piezoelectric energy harvesters.

The energy efficiency of piezoelectric energy harvesters may be enhanced by incorporation of a metamaterial-based substrate having preferred mechanical properties.

SUMMARY

The subject matter disclosed in some detail below is directed to a metamaterial-based substrate (hereinafter "meta-substrate") designed with mechanical properties that increase the transfer of vibrational energy from a vibration source to a piezoelectric element. Such metamaterial-based substrates may be incorporated in piezoelectric energy harvesters to increase electric power output. The piezoelectric element converts the vibration energy to electric current, which current may be used to provide electric power to a wireless device or charge a battery. As used herein, the term "meta-substrate piezoelectric energy harvester" (MPEH) means a piezoelectric energy harvester that includes a meta-substrate glued to a piezoelectric element.

In accordance with the embodiments disclosed herein, the meta-substrate combines two metamaterial-based topologies: kirigami and auxetic. The meta-substrate adds the negative Poisson's ratio capability to the kirigami substrate. A MPEH incorporating a meta-substrate of the type disclosed herein has enhanced multi-directional expansion with an adequate deformation compared to conventional piezoelectric energy harvesters. The meta-substrate enhances the mechanical properties/behaviors of the MPEH by the interplay between materials and specially designed geometries. The meta-substrate stretches the piezoelectric element of the MPEH in two directions at once due to its auxetic negative Poisson's ratio. The meta-substrate behaves more flexibly than a plain substrate with enhanced strain capacity owing to its kirigami cuts which boost the stress concentrations into the piezoelectric element of the MPEH. The creative design of the meta-substrate can improve strain-induced vibration in applications wherein energy efficiency is dependent on deformation performance. The mechanical properties of the meta-substrate increase the tensile deformation capacity and energy conversion efficiency of the piezoelectric energy harvester.

The design of the meta-substrate combines kirigami and auxetic topologies to create a high-performance platform including preferable mechanical properties of both metamaterial morphable structures. The creative design of the meta-substrate can improve strain-induced vibration applications in structural health monitoring (SHM) systems, internet-of-things (IoT) systems, micro-electromechanical systems, wireless sensor networks, vibration energy harvesters, and other applications where energy efficiency is dependent on deformation performance. The meta-substrate energy harvesting device comprises a meta-material substrate that includes an auxetic frame having two kirigami cuts, a piezoelectric element, and a thin layer of elastic glue that bonds the piezoelectric element to the auxetic frame. As used herein, the term "elastic glue" means a glue that is able to undergo high strains without adhesive or cohesive failure, such as epoxy or silicone. The harvested power output of a piezoelectric energy harvester incorporating the meta-substrate disclosed herein is many times greater than the power produced by a piezoelectric energy harvester having a similar piezoelectric element adhered to a plain substrate. As used herein, the term "plain substrate" means a substrate made of a structure having a positive Poisson's ratio.

Although various embodiments of piezoelectric energy harvesters having a meta-substrate coupled (e.g., glued) to a piezoelectric element and of wireless sensor networks having sensor nodes powered by such piezoelectric energy harvesters are described in some detail below, one or more of those embodiments may be characterized by one or more of the following aspects.

One aspect of the subject matter disclosed in detail below is a meta-material substrate comprising first and second walls and first and second flexible structures which connect the first wall to the second wall, wherein: the first flexible structure comprises a first flexural element integrally connected to the first wall by a first flexural hinge and a second flexural element integrally connected to the second wall by a second flexural hinge; the second flexible structure comprises a third flexural element integrally connected to the first wall by a third flexural hinge and a fourth flexural element integrally connected to the second wall by a fourth flexural hinge; the first and second flexural elements form a first cut when the first flexible structure is in an unflexed state and are connected to each other by a fifth flexural hinge that closes a closed end of the first cut; and the third and fourth flexural elements form a second cut when the second flexible structure is in an unflexed state and are connected to each other by a sixth flexural hinge that closes a closed end of the second cut. The first through fourth flexural elements bend at the first through fourth flexural hinges respectively and the fifth and sixth flexural hinges are separated by a gap that increases in size as the first and second walls move away from each other. In one proposed implementation, the first through fourth flexural elements are trapezoidal.

Another aspect of the subject matter disclosed in detail below is an energy harvesting device comprising: a meta-material substrate comprising an auxetic frame having first and second kirigami cuts; a layer of elastic glue adhered to the auxetic frame; and a piezoelectric element adhered to the layer of elastic glue.

A further aspect of the subject matter disclosed in detail below is a vehicle comprising: a host structure that vibrates during movement of the vehicle; an energy harvesting device that is coupled to the host structure and configured to convert vibrations to electric power; and an electrical device mounted to the host structure and connected to receive electric power that was generated by the energy harvesting device, wherein the energy harvesting device comprises a meta-material substrate that is coupled to the host structure and comprises an auxetic frame having first and second kirigami cuts; a layer of elastic glue adhered to a surface of the auxetic frame; and a piezoelectric element adhered to the layer of elastic glue. The electrical device comprises a sensor unit, a transmitter, a microprocessor, and memory which receive electric power from the energy harvesting device.

Yet another aspect of the subject matter disclosed in detail below is a sensor network in an aircraft for collecting data about the aircraft, the sensor network comprising: a wireless router attached to the aircraft; and a self-powered sensor node attached to a structural part of the aircraft and wirelessly communicatively coupled to the wireless router. The self-powered sensor node comprises a sensor unit configured to sense a condition or property of the structural part in a detection zone, a transmitter configured to transmit sensor data signals that carry information indicating the sensed condition or property, and an energy harvesting device coupled to the structural part of the aircraft and configured to convert vibrations to electric power. The energy harvesting device comprises a meta-material substrate that is coupled to the structural part and comprises an auxetic frame having first and second kirigami cuts, a layer of elastic glue adhered to the auxetic frame, and a piezoelectric element adhered to the layer of elastic glue.

A further aspect is a method for energy harvesting comprising: coupling a meta-material substrate to a host structure that has vibrational modes; coupling a piezoelectric element to the meta-material substrate; connecting the piezoelectric element to a device capable of receiving electric power; amplifying strain waves produced in the host structure using the meta-material substrate; converting the amplified strain waves into electrical power using the piezoelectric element; and supplying the electrical power to the device, wherein the meta-material substrate comprises an auxetic frame having first and second kirigami cuts.

Other aspects of piezoelectric energy harvesters having a meta-substrate coupled to a piezoelectric element and wireless sensor networks having sensor nodes powered by such piezoelectric energy harvesters are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams briefly described in this section are drawn to scale.

Reference will hereinafter be made to the drawings in which similar elements in different drawings bear the same reference numerals.

DETAILED DESCRIPTION

For the purpose of illustration, various embodiments of a piezoelectric energy harvester having a meta-substrate coupled to a piezoelectric element and an embodiment of a wireless sensor network having sensor nodes powered by such piezoelectric energy harvesters will now be described in detail. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The meta-substrates disclosed in some detail below are designed with mechanical properties that increase the transfer of vibrational energy from a vibration source to a piezoelectric element. Such meta-substrates may be incorporated in piezoelectric energy harvesters to increase electric power output. The piezoelectric element converts the vibration energy to electric current, which current may be used to provide electric power to a wireless device or charge a battery.

Figure 1:
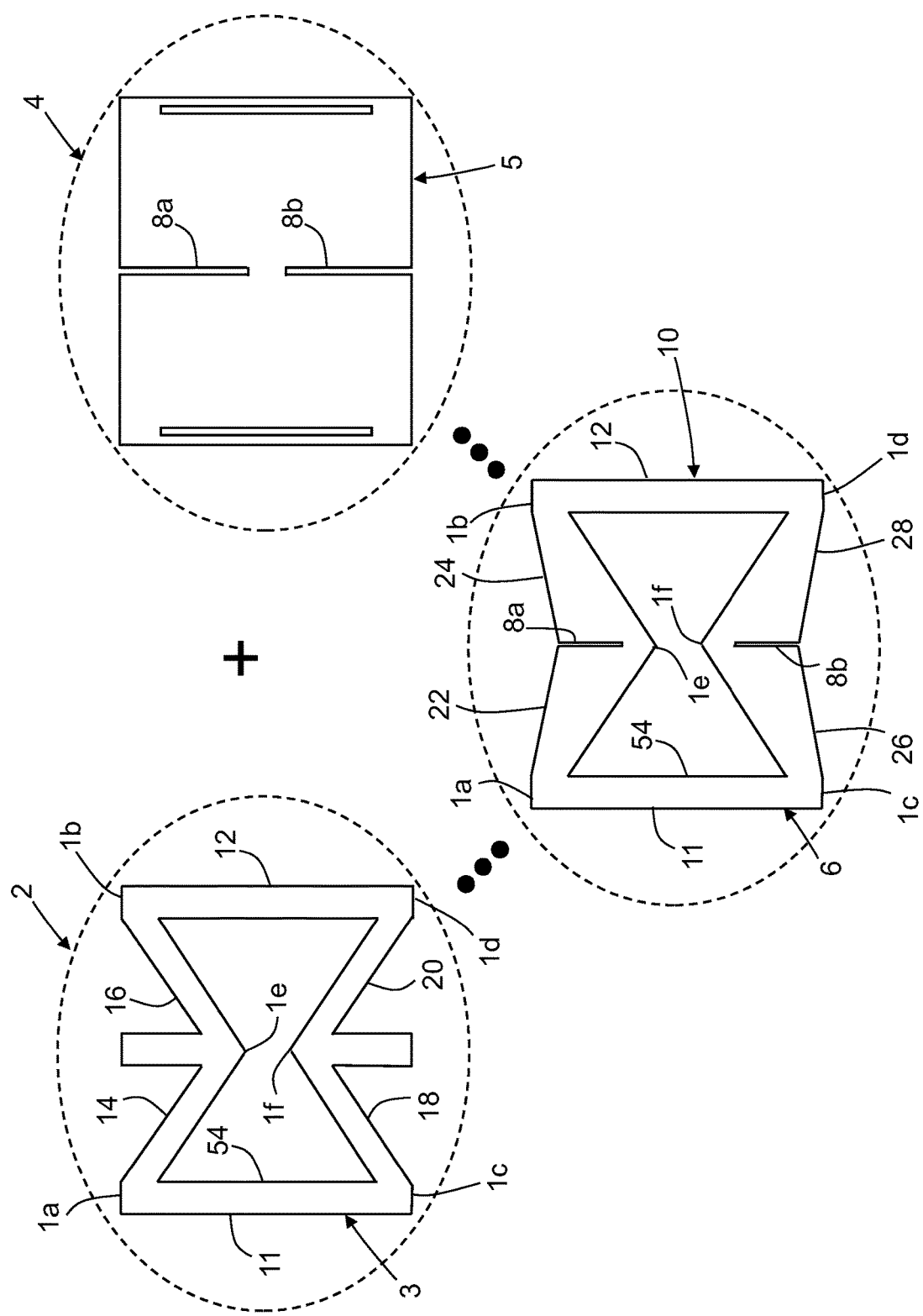
FIG. 1 is a diagram showing the concept of combining two different metamaterial-based topologies—kirigami and auxetic—to construct a meta-substrate suitable for boosting the efficiency of a piezoelectric energy harvester.

In accordance with the embodiments disclosed herein, the meta-substrate combines two metamaterial-based topologies: kirigami and auxetic. The meta-substrate adds the negative Poisson's ratio capability to the kirigami substrate. FIG. 1 is a diagram showing the concept of combining an auxetic cell 2 and a kirigami cell 4 to construct a meta-substrate cell 10 having a combined kirigami-auxetic topology suitable for enhancing the efficiency of a piezoelectric energy harvester. All of the cells are deformable, but are shown in FIG. 1 in their respective undeformed states.

The auxetic cell 2 in this example includes a deformable hexagonal frame 3 that defines a bowtie-shaped opening 54. More specifically, the shape of opening 54 is a six-sided concave polygon formed by three sets of parallel lines. The deformable hexagonal frame 3 comprises a wall 11, a wall 12, a first flexible structure 14/16 which connects wall 11 to wall 12, and a second flexible structure 18/20 which connects wall 11 to wall 12. More specifically, the first flexible structure includes a first flexural element 14 integrally connected to the wall 11 by a first flexural hinge 1a and a second flexural element 16 integrally connected to the wall 12 by a second flexural hinge 1b, while the second flexible structure includes a third flexural element 18 integrally connected to the wall 11 by a third flexural hinge 1c and a fourth flexural element 20 integrally connected to the wall 12 by a fourth flexural hinge 1d. The first and second flexural elements 14 and 16 are connected to each other by a fifth flexural hinge 1e, while the third and fourth flexural elements 18 and 20 are connected to each other by a sixth flexural hinge 1f. The fifth and sixth flexural hinges 1e and 1f are separated by a gap that is the narrowest point of opening 54. The deformable hexagonal frame 3 is designed such that the size of the gap increases as the walls 11 and 12 move away from each other.

The kirigami cell 4 in this example includes a deformable substrate 5 having first and second cuts 8a and 8b which are uniaxial when the deformable substrate 5 is undeformed as depicted in FIG. 1. The topologies of the auxetic cell 2 and kirigami cell 4 may be combined to form a meta-substrate cell 10 in a manner that adds the cuts 8a and 8b of the kirigami cell 4 to the negative Poisson's ratio capability of the auxetic cell 2.

The meta-substrate cell 10 in this example includes a deformable frame 6 that defines a bowtie-shaped opening 54. The deformable frame 6 comprises a wall 11, a wall 12, a first flexible structure 22/24 which connects wall 11 to wall 12, and a second flexible structure 26/28 which also connects wall 11 to wall 12. More specifically, the first flexible structure includes a first flexural element 22 integrally connected to the wall 11 by a first flexural hinge 1a and a second flexural element 24 integrally connected to the wall 12 by a second flexural hinge 1b, while the second flexible structure includes a third flexural element 26 integrally connected to the wall 11 by a third flexural hinge 1c and a fourth flexural element 28 integrally connected to the wall 12 by a fourth flexural hinge 1d. The first through fourth flexural elements each have a trapezoidal shape.

The first and second flexural elements 22 and 24 form a first cut 8a when the first flexible structure is in an unflexed (undeformed) state and are connected to each other by a fifth flexural hinge 1e that closes a closed end of the first cut 8a. Similarly, the third and fourth flexural elements 26 and 28 form a second cut 8b when the second flexible structure is in an unflexed (undeformed) state and are connected to each other by a sixth flexural hinge 1f that closes a closed end of the second cut 8b. The first and second cuts 8a and 8b are collinear when the first and second flexible structures are in their unflexed (undeformed) states. The fifth and sixth flexural hinges 1e and 1f are separated by a gap that is the narrowest point of opening 54. The deformable frame 6 is designed such that the size of the gap increases as the walls 11 and 12 move away from each other, as will be shown later with reference to FIGS. 6A and 6B.

The meta-substrate cell 10 seen in FIG. 1 may be incorporated as a central portion in a larger meta-substrate that is coupled (e.g., glued) to a host structure that has vibrational modes. Piezoelectric energy harvesters comprising such meta-substrates will be described in more detail below with reference to FIGS. 7-11. In those cases, the meta-substrate cell 10 may be coupled (e.g., glued) to one or two piezoelectric elements which convert the vibrations into electric power. For example, the walls 11 and 12 may be integrally formed with or attached to respective plates made of the same metamaterial used to fabricate the auxetic frame 6. Suitable materials include aluminum, steel, stainless steel, polymer, and fiber-reinforced plastic composites. As the plates move alternatingly toward and away from each other along a longitudinal axis under the effect of vibration, the flexible structures that connect walls 11 and 12 expand and retract alternatingly in a transverse direction, which transverse motion is imparted to the one or two piezoelectric elements.

In alternative embodiments, multiple meta-substrate cells 10 may be arranged in series to form a cantilever beam having one end affixed to a host structure that has vibrational modes. Such host structures will be described in more detail below with reference to FIG. 12. In this case, each meta-substrate cell 10 in the row of cells is coupled to a respective piezoelectric element or sandwiched between a respective pair of piezoelectric element which convert the vibrations into electric power. For example, the wall 12 of one meta-substrate cell may be integrally formed with or attached to the wall 11 of an adjacent cell.

The meta-substrate cell 10 may be fabricated using laser cutting (a.k.a. laser beam machining) or a 3-D or 4-D printing technique (also known as additive manufacturing) or both techniques depending on the application of the meta-substrate. To clarify, for example, if the meta-substrate is intended to be used as an embedded device, the best way to manufacture the whole structure (meta-substrate+host structure) is by using a 3-D or 4-D printing process. According to the usage, the material of the meta-substrate might be changed from flexible (polymer) to hard (steel), in which case the use of a laser cutter would be preferred as a faster/cheaper alternative. Even the size of the meta-substrate may be an important factor in deciding to use additive manufacturing for making the meta-substrate. For smaller applications, the 3-D or 4-D printing could be a more precise method.

As used herein, the terms "3-D printing" and "additive manufacturing" are used synonymously to refer to processes in which material is joined or solidified under computer control to create a three-dimensional object, with material being added together. One advantage of the 3-D printing methodology is that continuous fiber rovings (e.g., carbon fibers) impregnated with a liquid epoxy-hardener mixture can be printed without human manipulation in an autonomous manner.

Figure 2:
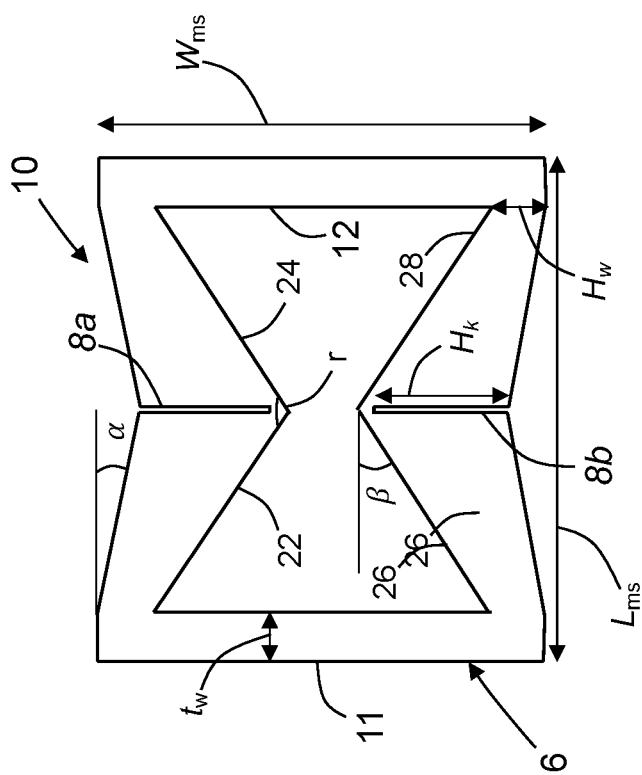
FIG. 2 is a diagram and a table respectively showing and listing various dimensions of a meta-substrate cell comprising an auxetic frame (negative Poisson's ratio) having first and second kirigami cuts in accordance with one design.

FIG. 2 is a diagram and a table respectively showing and listing various dimensions of a meta-substrate cell 10 comprising an auxetic frame 6 (negative Poisson's ratio) having first and second kirigami cuts 8a and 8b in accordance with one design. The meta-substrate applies some kirigami cuts to an auxetic framework to increase multi-directional expansion by enabling an adequate amount of deformation. The meta-substrate unit cell configuration with details is shown in FIG. 2, while various dimensional parameters are defined in the table. This design is based on a network of connected four trapezoids (first through fourth flexural elements 22, 24, 26, 28) with two opposing kirigami cuts 8a and 8b. FIG. 2 shows the meta-substrate cell 10 in an undeformed state. When this structure is placed under tension, the kirigami cuts open up and the trapezoids swing outward, causing the meta-substrate cell 10 to expand in both the longitudinal and transverse directions. In the undeformed state, the internal cell angle β may be equal to or greater than the external cell angle α. In the deformed state, the external cell angle α may optionally be approximately equal to 0 degrees (as seen in FIG. 6B).

Figure 3:
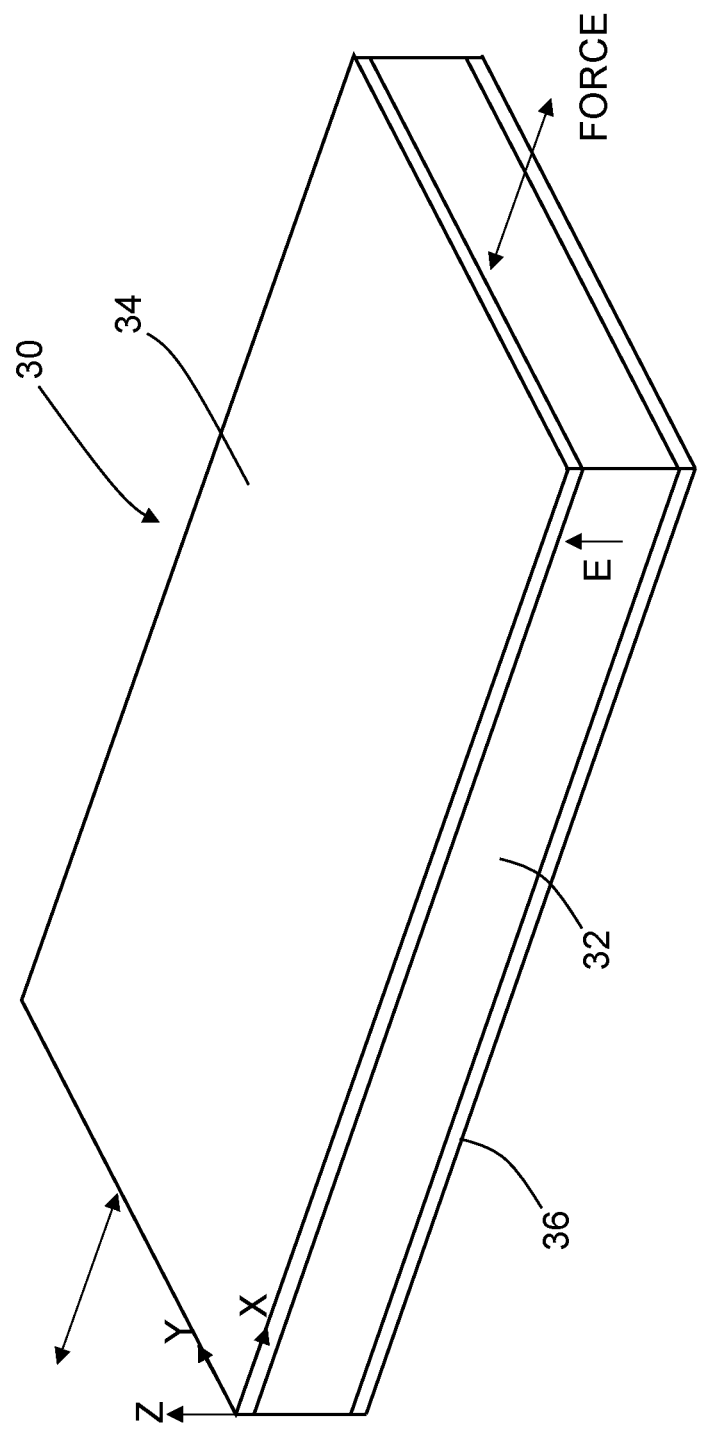
FIG. 3 is a diagram representing a three-dimensional (3-D) view of a piezoelectric element. The double-headed arrows indicate a tension or compression force being applied to opposing ends of the piezoelectric element in a direction parallel to the X axis.

A meta-substrate piezoelectric energy harvester (MPEH) may be constructed by gluing a piezoelectric element to the meta-substrate cell 10 depicted in FIGS. 1 and 2. FIG. 3 is a diagram representing a 3-D view of a piezoelectric element 30. The piezoelectric element 30 includes a piezoelectric substrate 32 sandwiched between a pair of electrodes 34 and 36. The piezoelectric substrate 32 is made of a piezoelectric material; the electrodes 34 and 36 are made of electrically conductive material. The double-headed arrows in FIG. 3 indicate a tension or compression force being applied to opposing ends of the piezoelectric element 30 in a direction parallel to the X axis.

One suitable piezoelectric material is lead zirconium titanate (PZT). PZT comprises a network of asymmetric dipole crystals which can be organized when any mechanical stresses are applied to the structure, which property enables PZT to generate electrical potentials in direct proportion to the applied forces. The constitutive equation for the electromechanical characteristic of a linear piezoelectric sensor is defined as:

$$\begin{Bmatrix} D \\ \sigma \end{Bmatrix} = \begin{bmatrix} \varepsilon^s & d \\ -d^T & k^E \end{bmatrix} \begin{Bmatrix} E \\ S \end{Bmatrix} \quad (1)$$

where D, σ, $k^E$, and $\varepsilon^S$ denote, respectively, the dielectric displacement vector (the electrical charge density), applied stress vector, stiffness matrix, and permittivity matrix; and S, $d^T$, and E represent the strain, piezoelectric constant matrix, and electric field, respectively. The following discussion assumes that the PZT is polarized along the thickness (Z) direction (see FIG. 3).

Accordingly, the piezoelectric constitutive equations will be expressed as:

$$\begin{Bmatrix} D_3 \\ \sigma_1 \end{Bmatrix} = \begin{bmatrix} \varepsilon^s_{33} & d_{31} \\ -d_{31} & k^E_{11} \end{bmatrix} \begin{Bmatrix} E_3 \\ S_1 \end{Bmatrix} \quad (2)$$

Figure 4:
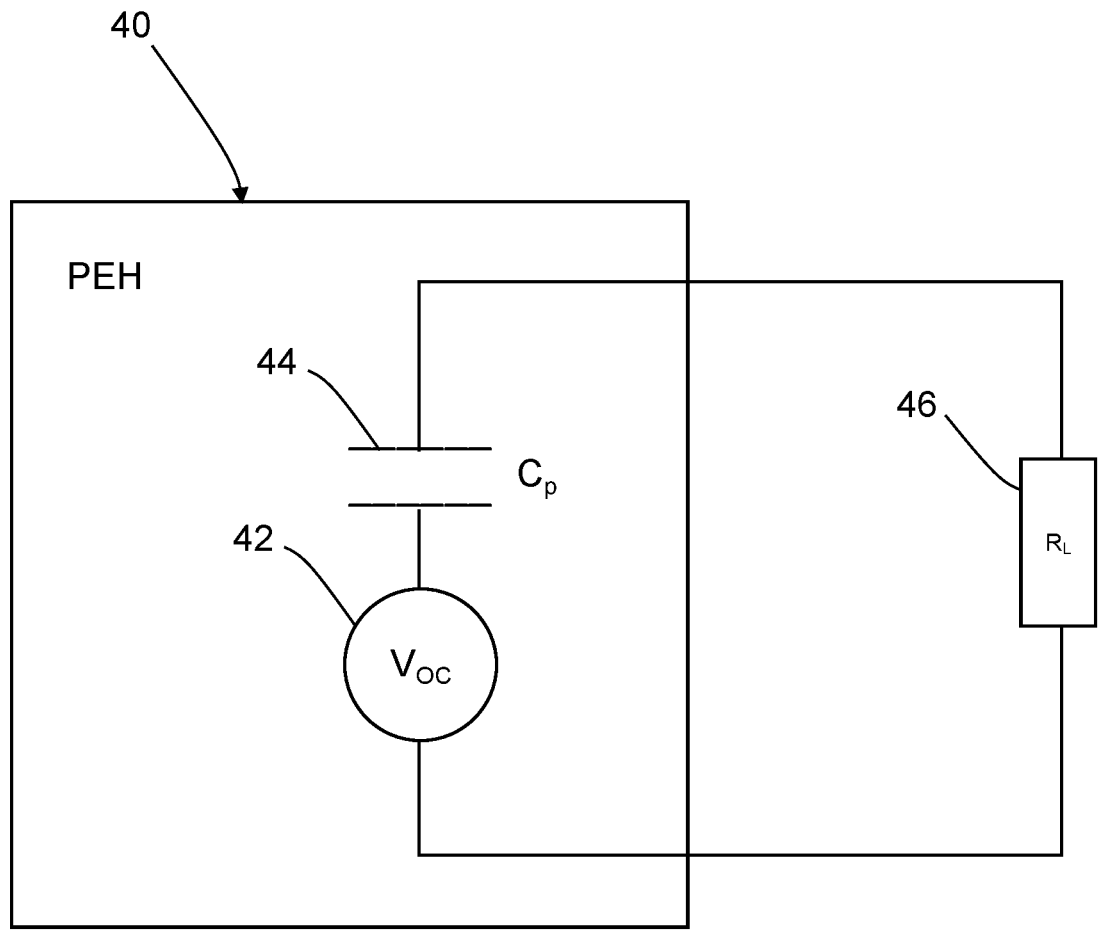
FIG. 4 is a diagram representing an equivalent circuit model of a piezoelectric energy harvester connected to a load resistor.

Assuming an isotropic behavior for the PZT and a plain stress condition ($\sigma_{33}=0$), the electric displacement along the Z axis may be defined as:

$$D_3 = d_{31}(\sigma_{11} + \sigma_{22}) \quad (3)$$

where the piezoelectric constant $d_{31}$ denotes the charge per electrode area per unit stress applied along the X axis. According to the conditions satisfying this equal-power requirement for a conventional piezoelectric energy harvester, a circuit model representing a strain energy harvester 40 connected to a load resistor 46 is depicted in FIG. 4. The strain energy harvester 40 is modeled as an open-circuit voltage generator 42 connected in series with a capacitor 44.

Due to the fact that the PZT ceramic is a bulk structure ($d_{31}=d_{32}$), when a uniaxial stretching load is applied to the strain energy harvester 40, the root mean square of the voltage for the open circuit of the PZT is calculated by Eqs. (4) and (5):

$$V_{OC} = \frac{t_p D_3}{\varepsilon_0 \varepsilon_{33} \sqrt{\pi}} = \frac{t_p d_{31}}{\varepsilon_0 \varepsilon_{33} \sqrt{\pi}} (\sigma_{11} + \sigma_{22}) \quad (4)$$

$$V_{RMS} = \frac{V_{OC}}{\sqrt{2}} \quad (5)$$

The maximum power output (see Eq. (7)) of the piezoelectric energy harvester is at the optimal load resistance (see Eq. (6)) which matches the internal impedance of the strain energy harvester:

$$R_L = \frac{1}{2\pi f C_p} = \frac{t_p}{2\pi f \varepsilon_0 \varepsilon_{33} A_p} \quad (6)$$

$$P_{opt} = \frac{V_{RMS}^2}{R_L} = \frac{f A_p t_p d_{31}^2}{\varepsilon_0 \varepsilon_{33}} (\overline{\sigma_{11}} + \overline{\sigma_{22}})^2 \quad (7)$$

where $t_p$ is the layer thickness of the PZT; f is the excitation frequency; $C_p$ is the PGP-capacitance between the electrodes of two sides of the PZT; $A_p$ is the electrode area of the PZT; $R_L$ is the load resistance; $\varepsilon_{33}$ is the relative permittivity of the PZT; and $\varepsilon_0$ is the permittivity of free space ($\varepsilon_0$=8.85× $10^{-12}$ c²/N-m²).

As expressed by Eq. (7), one may conclude that the electrical charge density of any piezoelectric energy harvester is proportionally related to the average lateral $\overline{\sigma_{22}}$ stress as well as axial $\overline{\sigma_{11}}$ stress. Hence, if one utilizes a piezoelectric energy harvester that includes a meta-substrate, one may expect to improve the power output of the piezoelectric energy harvester significantly because the meta-substrate stretches the PZT in two directions at once due to its negative Poisson's ratio. Furthermore, the meta-substrate behaves more stretchably with enhanced strain capacity owing to its kirigami cut, which can boost the stress concentrations into the piezoelectric element.

Figure 5A:
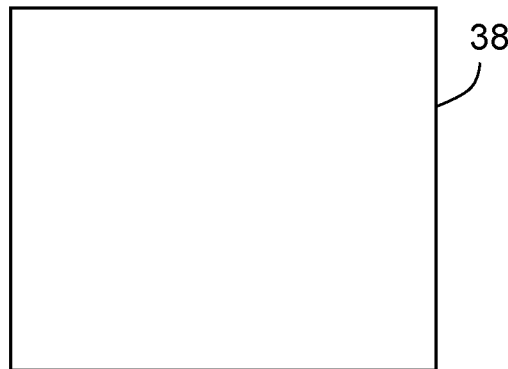
FIGS. 5A and 5B are diagrams representing top views of a plain substrate in an undeformed state (FIG. 5A) and in a deformed state (FIG. 5B). The arrows in FIG. 5B indicate the movements of various portions of the plain substrate when tensile forces are applied to opposite ends of the plain substrate.
Figure 5B:
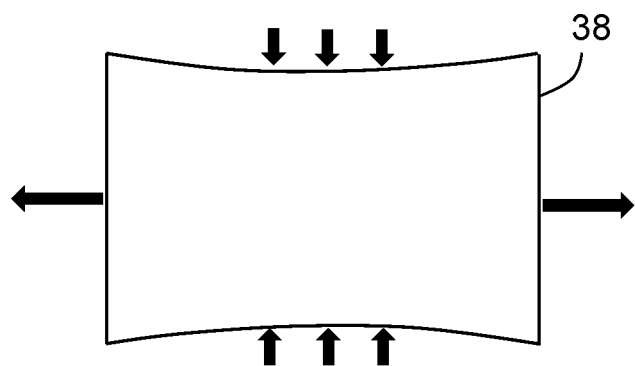

FIG. 5A is a diagram representing a top view of a plain substrate 38 in an undeformed state. As used herein, the term "plain substrate" means a substrate made of a material having a positive Poisson's ratio. FIG. 5B is a diagram representing a top view of a plain substrate 38 in a deformed (tensioned) state. The arrows in FIG. 5B indicate the movements of various portions of the plain substrate 38 when a tensile force is applied to opposite uncut ends of the plain substrate 38.

Figure 6A:
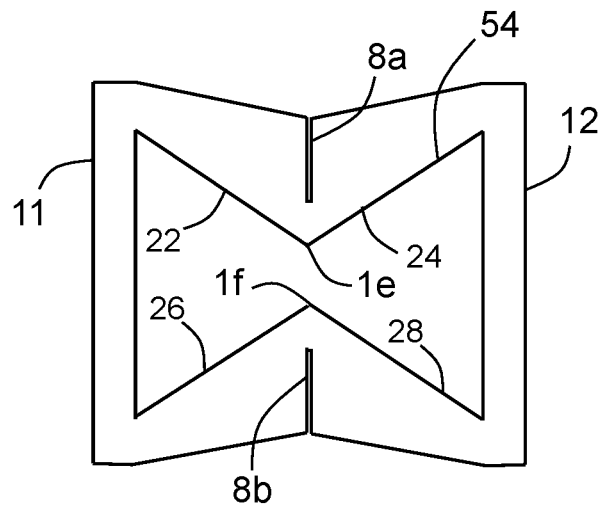
FIGS. 6A and 6B are diagrams representing top views of the meta-substrate cell depicted in FIG. 2 in an undeformed state (FIG. 6A) and in a deformed state (FIG. 6B). The arrows in FIG. 6B indicate the movements of various portions of the meta-substrate cell when tensile forces are applied to opposite ends of the cell.
Figure 6B:
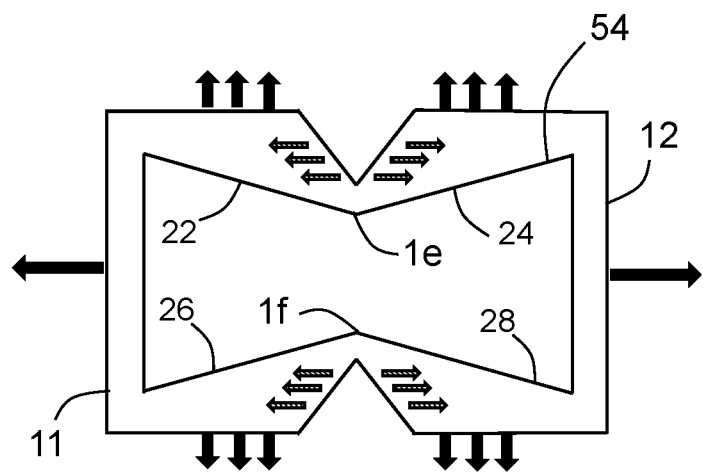

In contrast, FIG. 6A is a diagram representing a top view of the meta-substrate cell 10 depicted in FIGS. 1 and 2 in an undeformed state. FIG. 6B shows the same meta-substrate cell 10 in a deformed state. The arrows in FIG. 6B indicate the movements of the first through fourth flexural elements 22, 24, 26, 28 of the meta-substrate cell 10 when a tensile force is applied to walls 11 and 12 at opposite uncut ends of the meta-substrate cell 10. When this structure is placed under tension along the X axis, the cuts 8a and 8b open while the gap between the fifth and sixth flexural hinges 1e and 1f increases in size. More specifically, the bowtie shape of opening 54 tends toward rectangular as the first through fourth flexural elements 22, 24, 26, 28 flex outward in opposite transverse directions.

Figure 7:
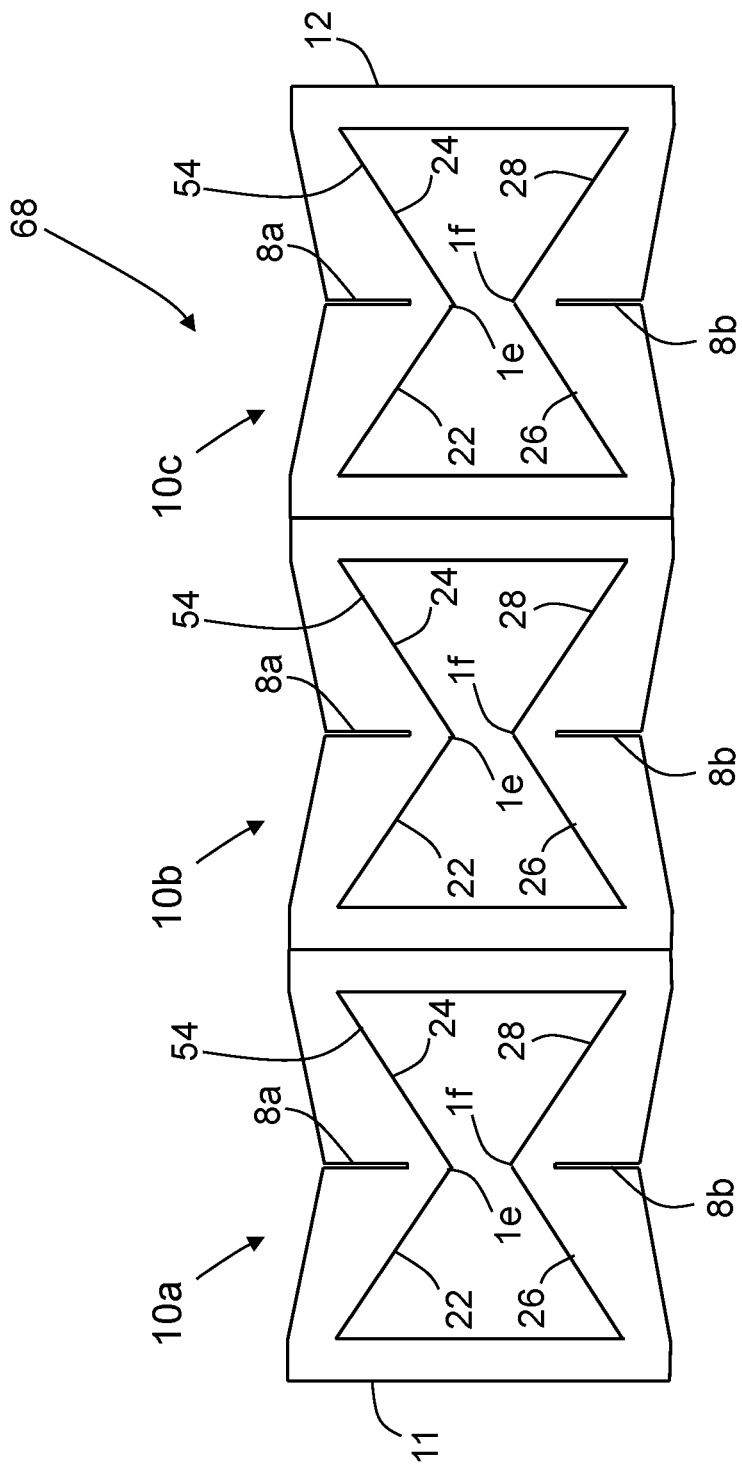
FIG. 7 is a diagram showing three meta-substrate cells connected in series to form a linear meta-substrate cell array without piezoelectric elements.

FIG. 7 is a diagram showing three meta-substrate cells 10a-10c connected in series to form a linear meta-substrate cell array 68 without piezoelectric elements. A strip-shaped MPEH may be formed by gluing respective piezoelectric elements. Such a linear meta-substrate cell array provides a preferred rectangular shape, but also accelerates the meta-substrate mechanism because each of the meta-substrate cells 10a-10c may axially push the next cell to produce synergistic vibrations.

Figure 8:
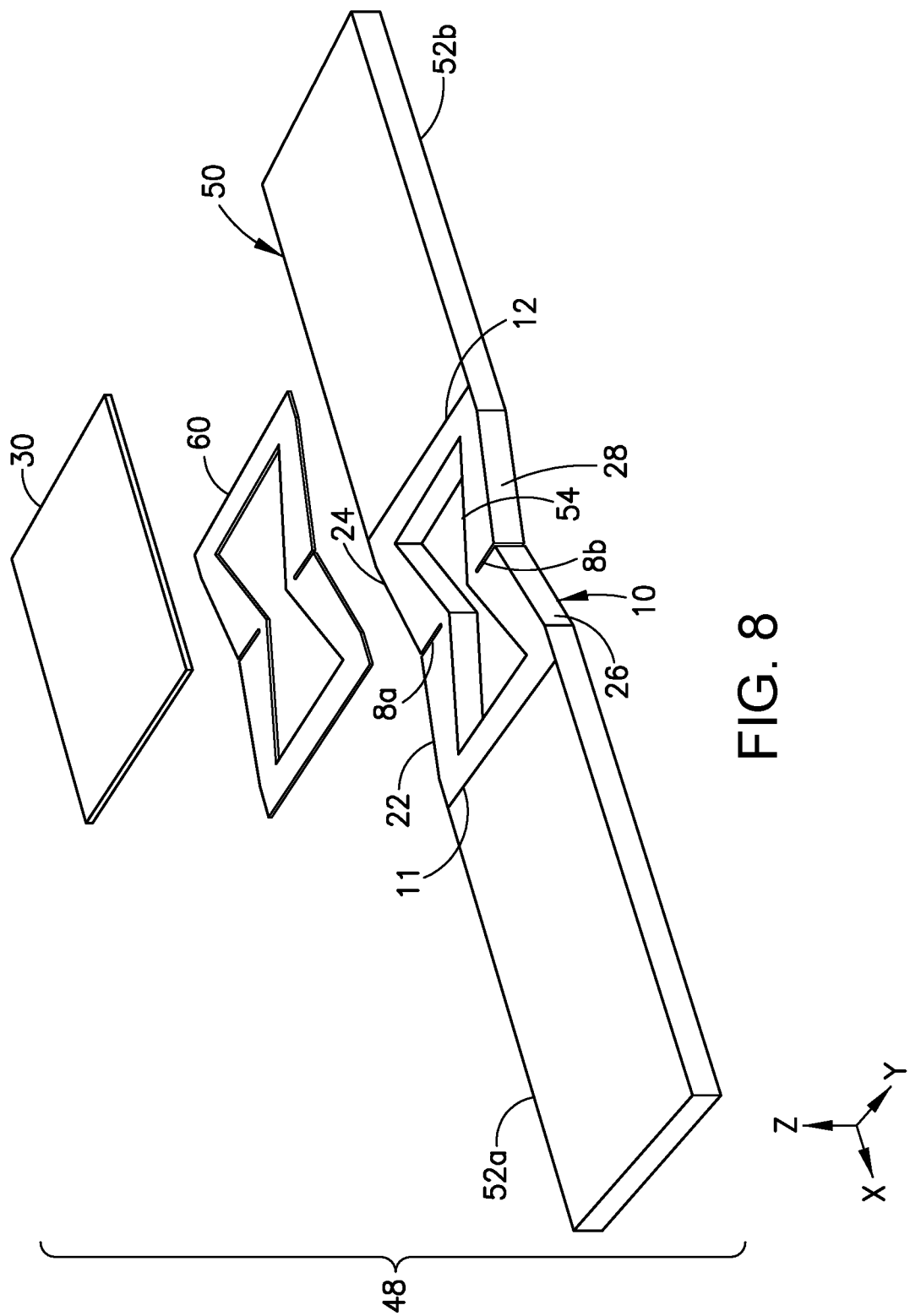
FIG. 8 is a diagram representing an exploded 3-D view of components of a meta-substrate piezoelectric energy harvester in accordance with another embodiment.
Figure 10:
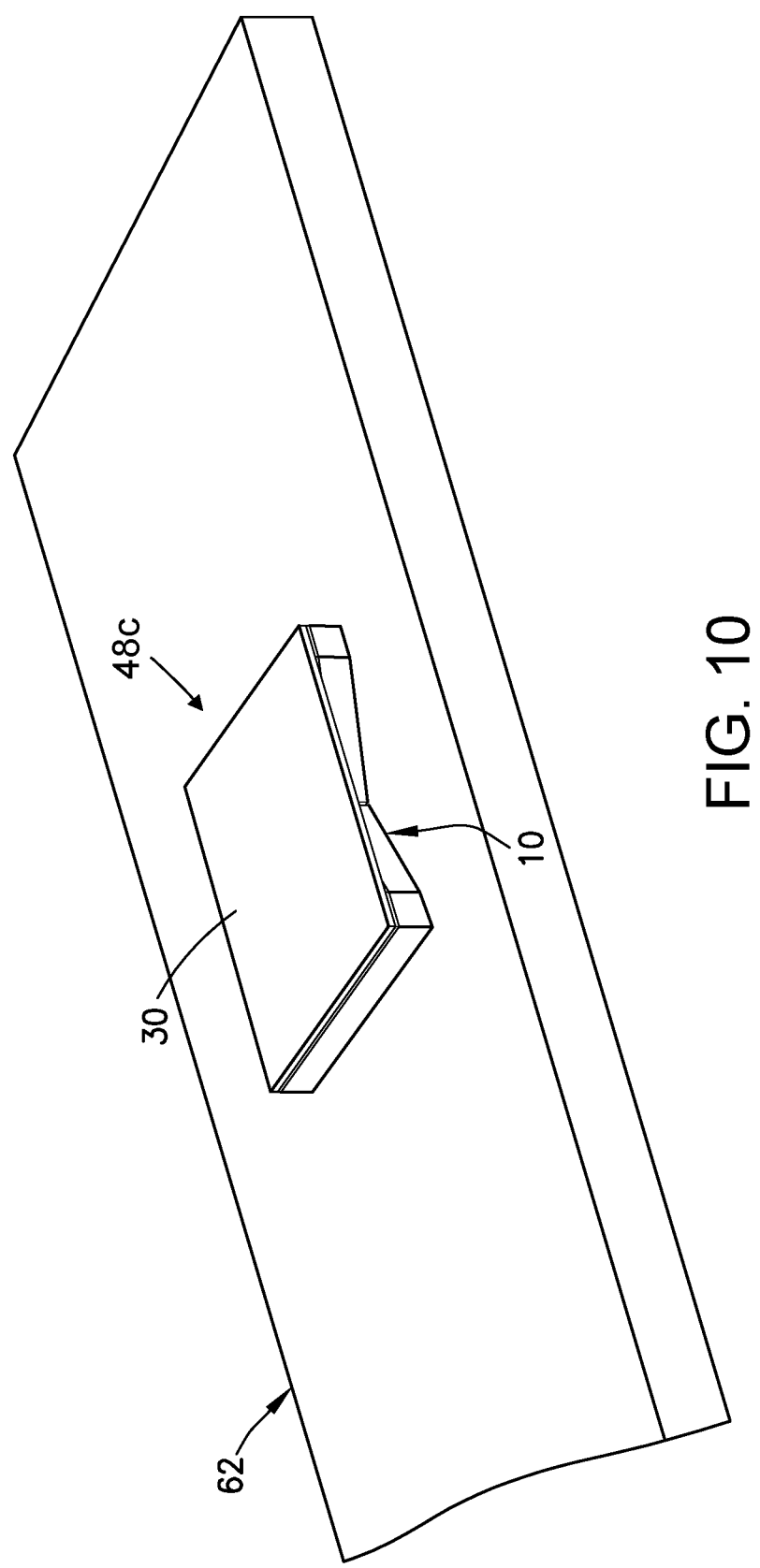
FIG. 10 is a diagram representing a 3-D view of a strain-type meta-substrate piezoelectric energy harvester in which a piezoelectric element is attached to a meta-substrate booster that is integrally formed with a host structure by the same manufacturing process, such as 3-D or 4-D printing.

FIG. 8 is a diagram representing an exploded 3-D view of components of a meta-substrate piezoelectric energy harvester 48 (hereinafter "MPEH 48") comprising a piezoelectric element 30 bonded to a meta-substrate cell 10 incorporated as a central portion in a larger meta-substrate 50. The meta-substrate 50 is coupled to a host structure that has vibrational modes. The piezoelectric element 30 is bonded to the meta-substrate cell 10 by a thin layer of elastic glue 60 (e.g., silicone or epoxy), which is applied on the upper surface of the meta-substrate cell 10. The meta-substrate cell 10 and plate-shaped bodies 52a and 52b are made of the same metamaterial. The walls 11 and 12 may be either integrally formed with or attached to the plate-shaped bodies 52a and 52b respectively of the meta-substrate 50. It should be appreciated that the lines in FIG. 10 indicating the boundaries of walls 11 and 12 are inapplicable in the case where the walls 11 and 12 are integrally formed with the plate-shaped bodies 52a and 52b respectively. The MPEH components depicted in FIG. 10 are assembled by gluing piezoelectric element 30 to meta-substrate cell 10, thereby coupling the two components together. The piezoelectric element 30 vibrates when the meta-substrate cell 10 vibrates. When the MPEH is in turn mounted to a component or part of a vehicle, the magnitude of vibrations induced in the piezoelectric element by the vibrating component or part will be magnified by the meta-substrate cell 10, thereby increasing the power efficiency of the MPEH.

Figure 9:
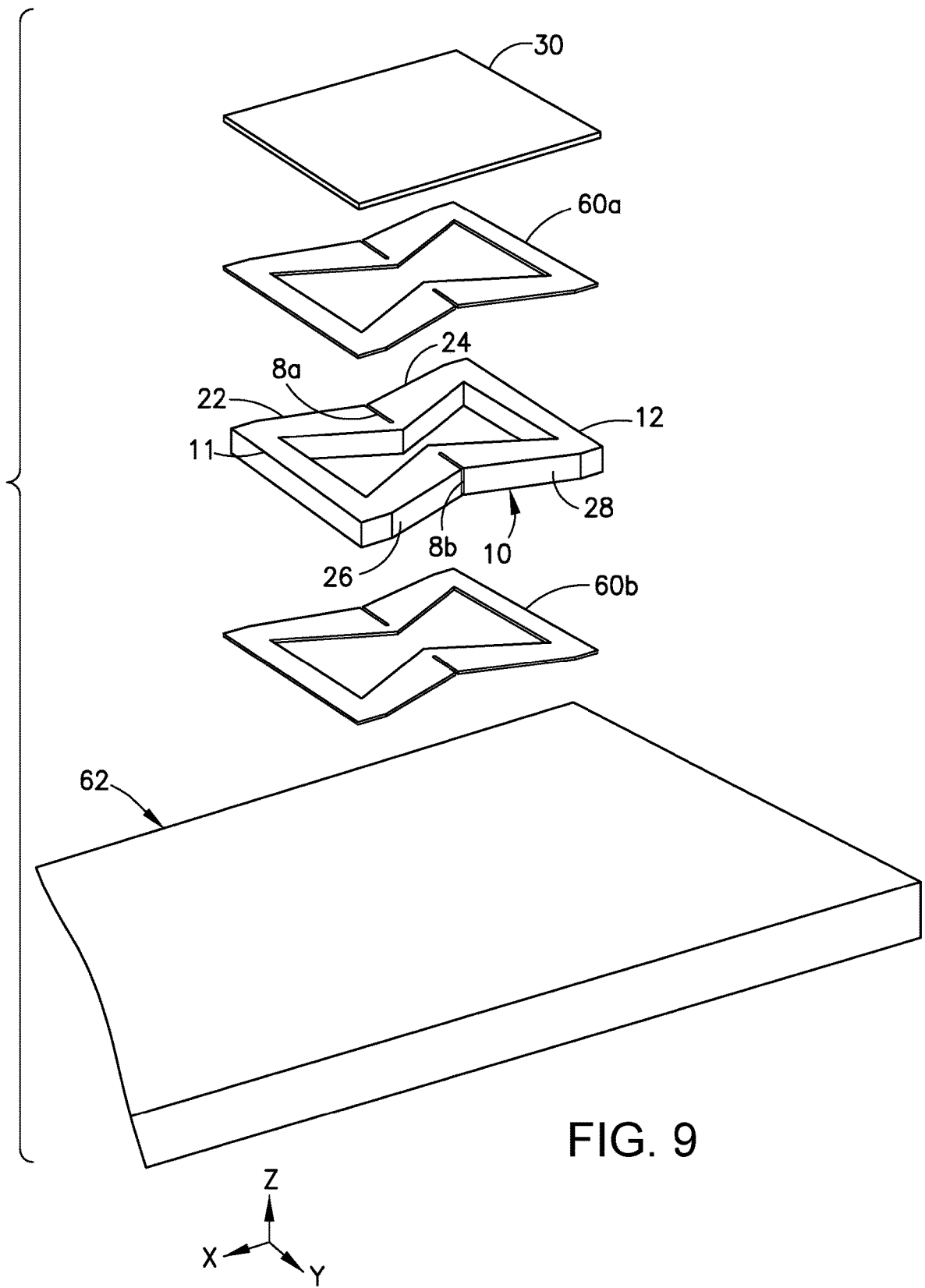
FIG. 9 is a diagram representing an exploded 3-D view of components of a strain-type piezoelectric energy harvester having a meta-substrate booster for general application to a host structure that has vibrational modes.

FIG. 9 is a diagram representing an exploded 3-D view of components of a strain-type piezoelectric energy harvester having a meta-substrate booster for general application to a host structure 62 that has vibrational modes. For example, the host structure 62 may be a shell plate. The harvester components include a piezoelectric element 30 and a meta-substrate cell 10. The meta-substrate cell 10 is configured to act as a booster that amplifies the strain waves produced by the host structure 62, thereby increasing the energy efficiency of the piezoelectric element 30. The piezoelectric element 30 will be bonded to the meta-substrate cell 10 by a first thin layer of elastic glue 60a (e.g., epoxy). The meta-substrate cell 10 in turn will be bonded to host structure 62 by a second thin layer of elastic glue 60b.

FIG. 10 is a diagram representing a 3-D view of a strain-type meta-MPEH 48c in which a piezoelectric element 30 is attached to a meta-substrate booster that has been integrally formed with a host structure 62 by the same manufacturing process, such as 3-D or 4-D printing. In this example, the meta-substrate booster is a meta-substrate cell 10 of the type depicted in FIGS. 6A and 6B. As the host structure 62 vibrates, the resulting strain waves are amplified by the meta-substrate cell 10, thereby enabling the piezoelectric element 30 to generate increased electrical power than would otherwise be the case were the piezoelectric element 30 simply glued directly to the host structure 62. The MPEH 48c may be constructed on the host structure 62 at any place where vibrational energy is available for harvesting.

Figure 11:
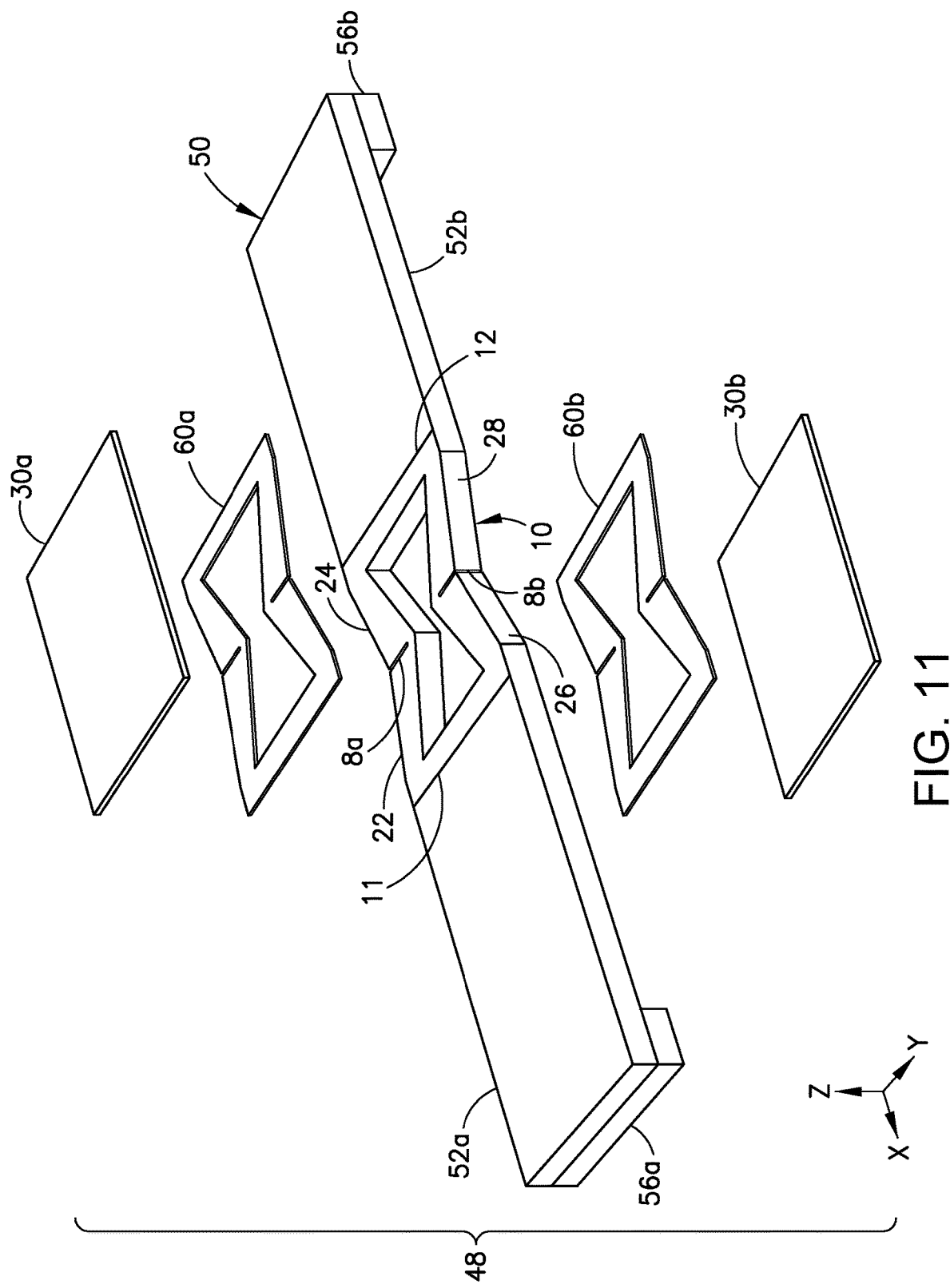
FIG. 11 is a diagram representing an exploded 3-D view of components of a meta-substrate piezoelectric energy harvester comprising a meta-substrate sandwiched between two piezoelectric elements in accordance with a further embodiment.

FIG. 11 is a diagram representing an exploded 3-D view of components of a MPEH 48 comprising a meta-substrate 50 sandwiched between two piezoelectric elements 30a and 30b in accordance with another embodiment. The first piezoelectric element 30a will be bonded to the meta-substrate cell 10 by a first thin layer of elastic glue 60a, which is applied on the upper surface of the meta-substrate cell 10. The second piezoelectric element 30b will be bonded to the meta-substrate cell 10 by a second thin layer of elastic glue 60b, which is applied on the lower surface of the meta-substrate cell 10. The MPEH components depicted in FIG. 11 are assembled by gluing piezoelectric elements 30a and 30b to meta-substrate cell 10, thereby coupling both piezoelectric elements to the meta-substrate cell. Thus, both piezoelectric elements 30a and 30b vibrate when the meta-substrate cell 10 vibrates.

Figure 12:
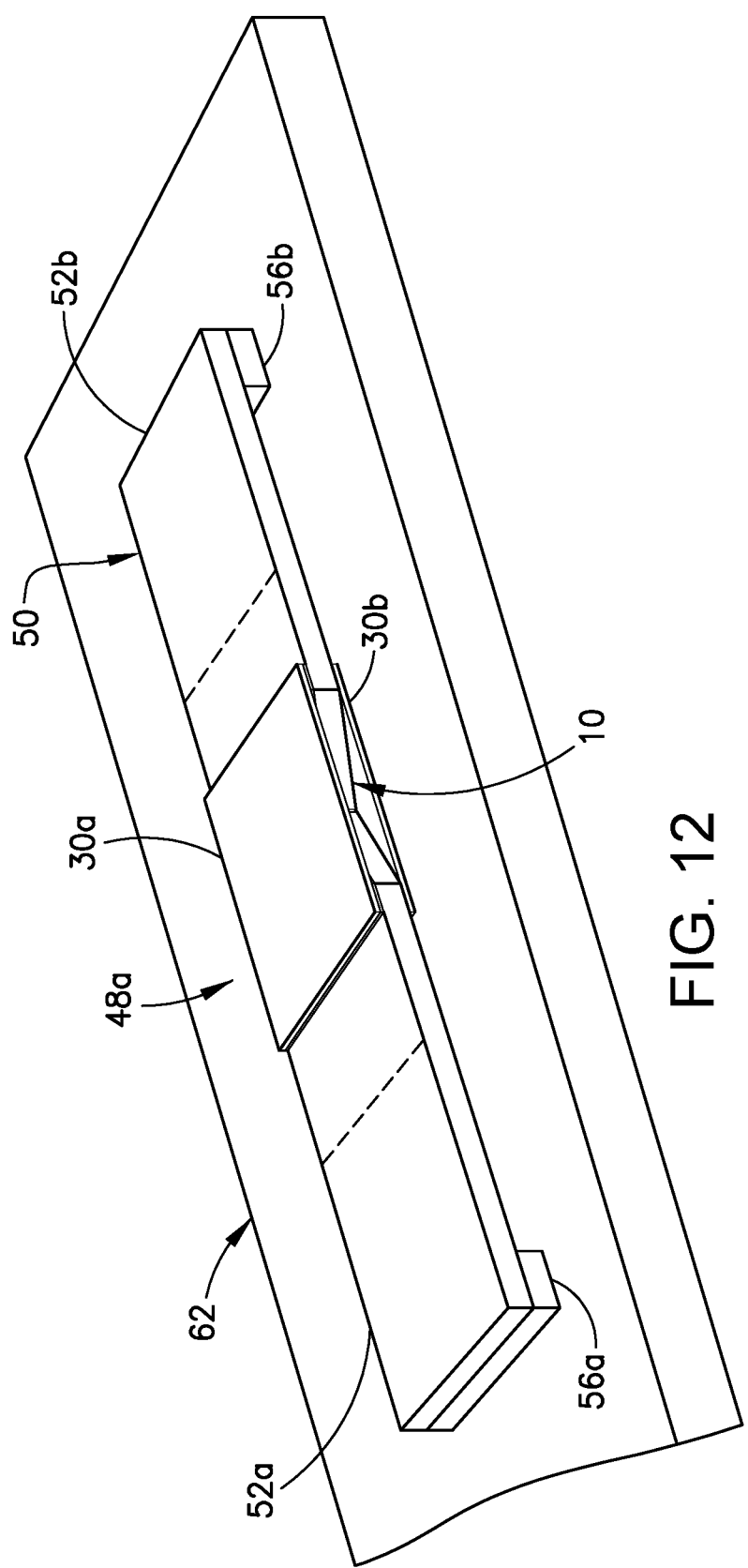
FIG. 12 is a diagram representing a 3-D view of the components depicted in FIG. 11 assembled on a host structure that has vibrational modes.

FIG. 12 is a diagram representing a 3-D view of the components depicted in FIG. 11 now assembled to form a strain type of MPEH 48a that bridges a pair of pedestals 56a and 56b (hereinafter "bridging MPEH 48a"). The bridging MPEH 48a is shown mounted to a host structure 62 that has vibrational modes. For example, the host structure 62 may be a vehicle component or part that is subject to vibration during vehicle movement. In the embodiment depicted in FIG. 12, the pedestals 56a and 56b are attached to the lower surface of meta-substrate 50 at opposite ends thereof. Those pedestals 56a and 56b in turn may be attached to the host structure 62. For example, in a case where the lower surface of meta-substrate 50 and the confronting surface of the host structure 62 are planar, the pedestals 56a and 56b are designed to ensure that the lower surface of meta-substrate 50 and the confronting surface of host structure 62 are parallel and separated by a gap having a height greater than the thickness of the piezoelectric element 30b. In this case, vibrations in the underlying host structure 62 cause the pedestals 56a and 56b to vibrate, which in turn causes the bridging MPEH 48a to amplify the vibration. The bridging MPEH 48a may, in the alternative, have one piezoelectric element 30 as depicted in FIG. 10 instead of two piezoelectric elements 30a and 30b as depicted in FIG. 12.

The MPEHs depicted in FIGS. 7-12 may be designed to vibrate at both high and low frequencies. At a low frequency, conventional piezoelectric energy harvesters are unable to generate any usable power. In contrast, a MPEH configured with cells having auxetic frames with two kirigami cuts makes it possible to generate usable power at low frequency. At low excitation, a small-sized (e.g., 20 mm) MPEH of the type proposed herein generates up to 3000 μW of power, which easily satisfies the minimum electric power required by a sensor node in a wireless sensor network. This generated power was for a unimorph MPEH (having one piezoelectric element) of the type depicted in FIG. 10 and will be almost doubled for a bimorph MPEH (having two piezoelectric elements) of the type depicted in FIG. 12. In addition, the power output will increase with increasing size. In addition, simulations demonstrated that a MPEH comprising an auxetic frame with two kirigami cuts: (a) generates 19.3 times more power than an equivalent conventional PEH at low frequencies (1-4 Hz) and sinusoidal strain amplitudes (50 to 550με); and (b) generates 18.1 times more power than an equivalent conventional PEH at high frequencies (100-1500 Hz). The power gain factor remained constant when the excitation was increased, which means the magnification factor is a function of the meta-substrate geometry and is not dependent on the excitation conditions.

Figure 13:
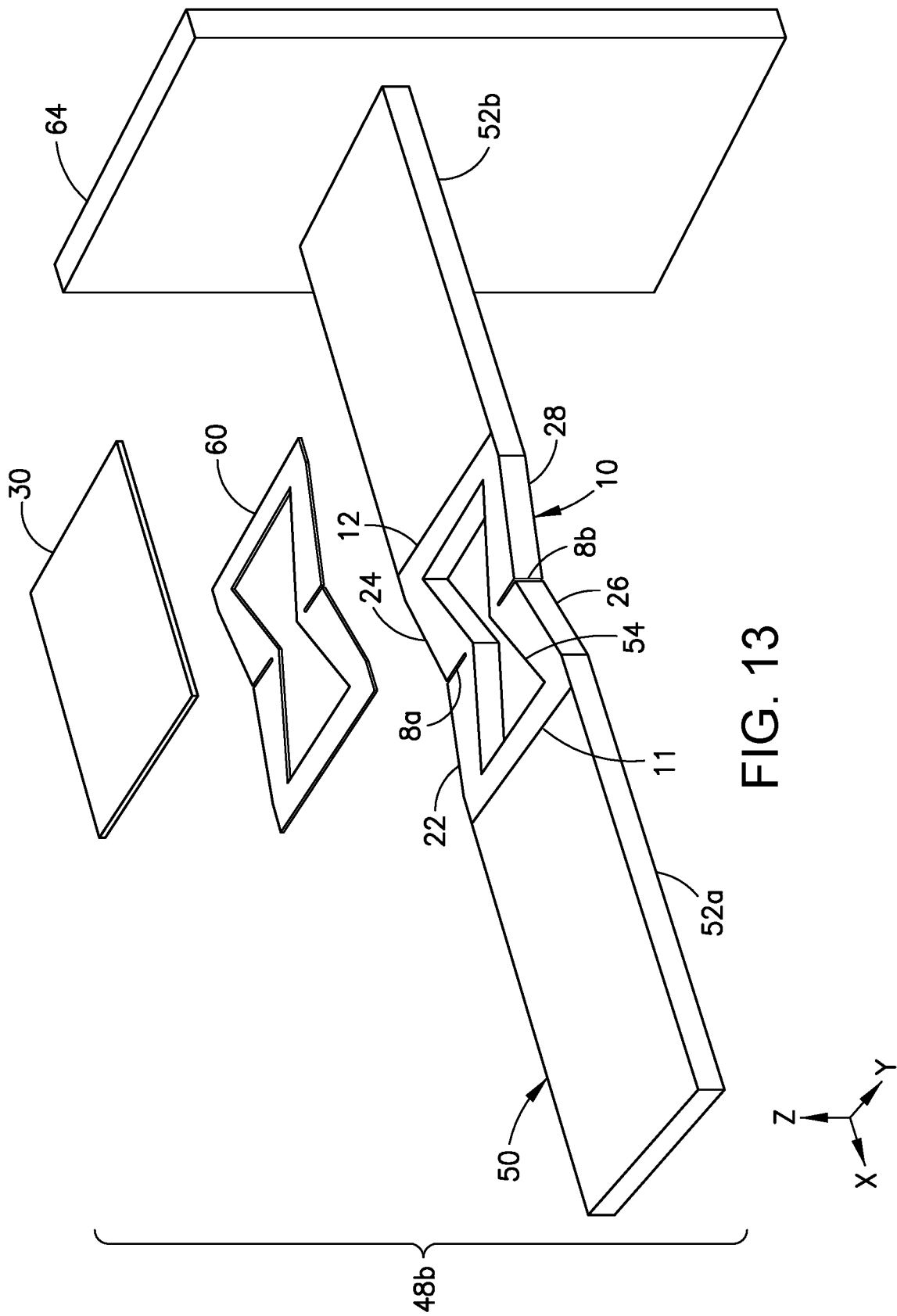
FIG. 13 is a diagram representing an exploded 3-D view of the components depicted in FIG. 10 now attached in cantilever beam fashion to a host structure that has vibrational modes.
Figure 14:
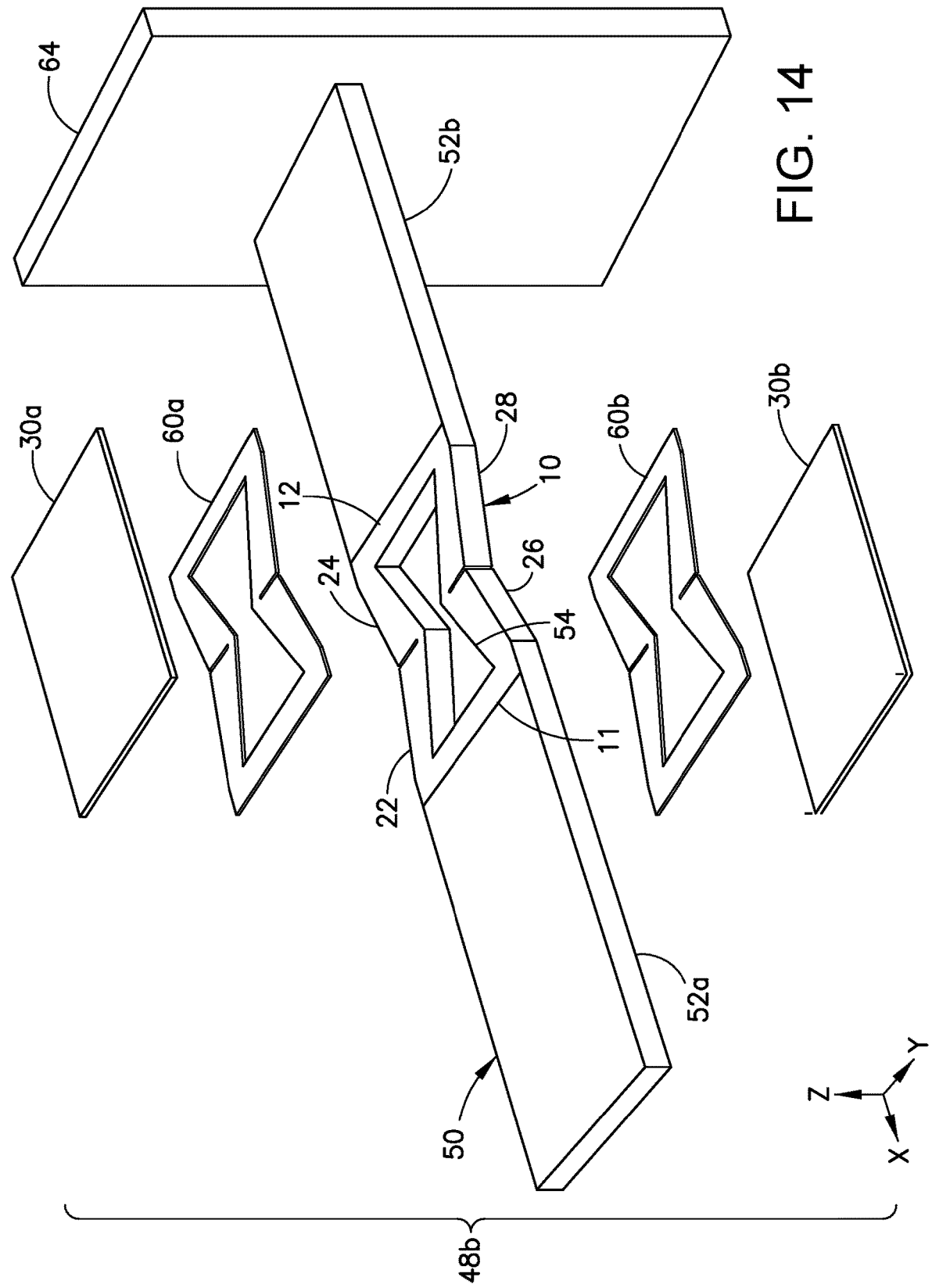
FIG. 14 is a diagram representing an exploded 3-D view of the components of an MPEH attached in cantilever beam fashion to a host structure that has vibrational modes.

In accordance with alternative embodiments, the meta-substrate 50 may be configured as a cantilever beam having one end attached to a host structure while the other end is unconstrained. FIG. 13 is a diagram representing an exploded 3-D view of a cantilevered MPEH 48b including the same components depicted in FIG. 10, with the difference that one end of the meta-substrate 50 is attached in cantilever beam fashion to a host structure 64 that is subject to vibration. Similarly, FIG. 14 is a diagram representing an exploded 3-D view of a cantilevered MPEH 48b including the same components depicted in FIG. 11, with the difference that one end of the meta-substrate 50 is attached in cantilever beam fashion to the host structure 64. At both high and low frequencies, the cantilevered MPEH generates a better power output (up to 10 times) compared to an equivalent conventional cantilevered PEH. This generated power was for a unimorph cantilevered MPEH (having one piezoelectric element 30) of the type depicted in FIG. 13 and will be almost doubled for a bimorph cantilevered MPEH (having two piezoelectric elements 30a and 30b) of the type depicted in FIG. 14.

In accordance with further embodiments, multiple MPEHs may be constructed using a meta-substrate honeycomb structure in strip or shell shapes to create cantilever beams of different lengths designed to harvest energy in respective different ranges of excitation frequency. These multiple different cantilevered MPEHs, operating in unison, form a multi-frequency cantilevered MPEH array that generates power in a broadband frequency range.

Figure 15:
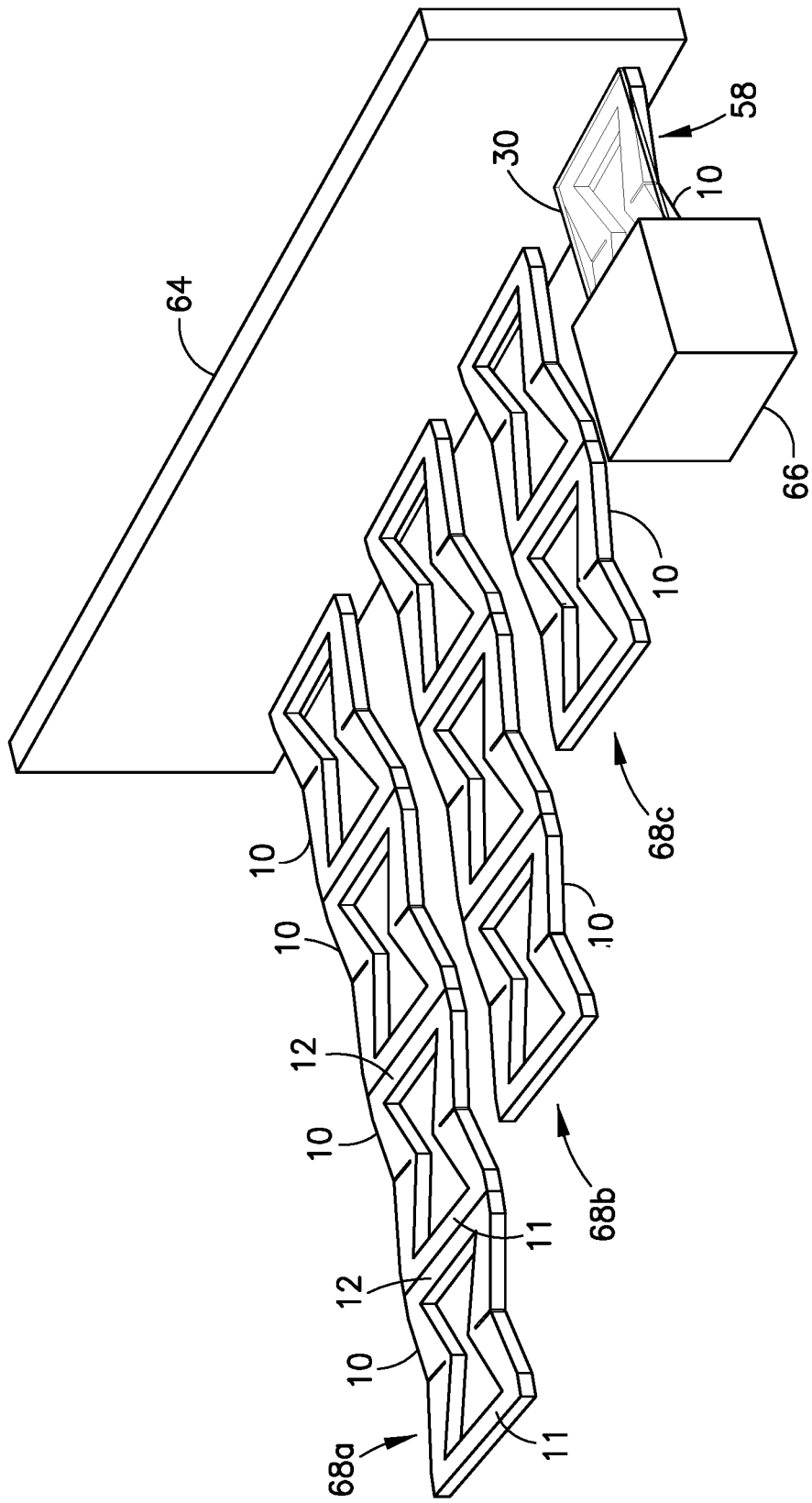
FIG. 15 is a diagram representing 3-D views of four configurations of meta-substrate cell arrays to make a multi-frequency harvesting set-up attached in cantilever beam fashion to a host structure that has vibrational modes.

FIG. 15 is a diagram representing 3-D views of four configurations of meta-substrate cells 10 attached in cantilever beam fashion (in some cases, in series) to a host structure 64 that is subject to vibration when in service. The cantilevered linear meta-substrate cell array 68a includes four meta-substrate cells 10 connected in series (wall to wall) and affixed to host structure 64. The cantilevered linear cell array 68b includes three meta-substrate cells 10 connected in series and affixed to host structure 64. The cantilevered linear meta-substrate cell array 68c includes two meta-substrate cells 10 connected wall to wall and affixed to host structure 64. A respective piezoelectric element (not shown in FIG. 15) may be attached to each meta-substrate cell 10 to form cantilevered MPEHs respectively having different modes of vibration. FIG. 15 further depicts a mass 66 attached to one end of a cantilevered MPEH 58 that has the other end affixed to the host structure 64. The cantilevered MPEH 58 includes a single piezoelectric element glued to a single meta-substrate cell 10. Optionally, to tune the resonance frequency of the cantilevered MPEH 58, a mass 66 may be attached to the distal end of any one of the cantilevered linear meta-substrate cell arrays 68a-68c depicted in FIG. 15. The mass may be selected in dependence on the desired vibrational mode.

As the resonance frequency of any cantilever beam depends on certain design parameters (mass, modulus of elasticity, and thickness of the piezoelectric element as well as the meta-substrate), one can design beams with different sizes using meta-substrate honeycomb structures (strip and shell shapes) that are respectively configured to have bending modes responsive to different excitation frequencies. To clarify, a tuning technique may be used to induce maximum tensile deformations in the respective piezoelectric materials over a wide range of excitation frequencies. Different arrangements of strips of meta-substrate (coupled to piezoelectric elements) in various lengths may be set up to harness ambient vibration in a broad input frequency range, thereby providing a multi-frequency cantilevered MPEH array. As the device vibrates over a range of input frequencies, more than one member resonates or is close to resonance. Such arrangements enable multiple members to work in conjunction to create power concurrently. It is possible to create booster or cantilever beams of different sizes in dependence on the vibrational modal frequencies to be harnessed for a particular application.

Figure 16:
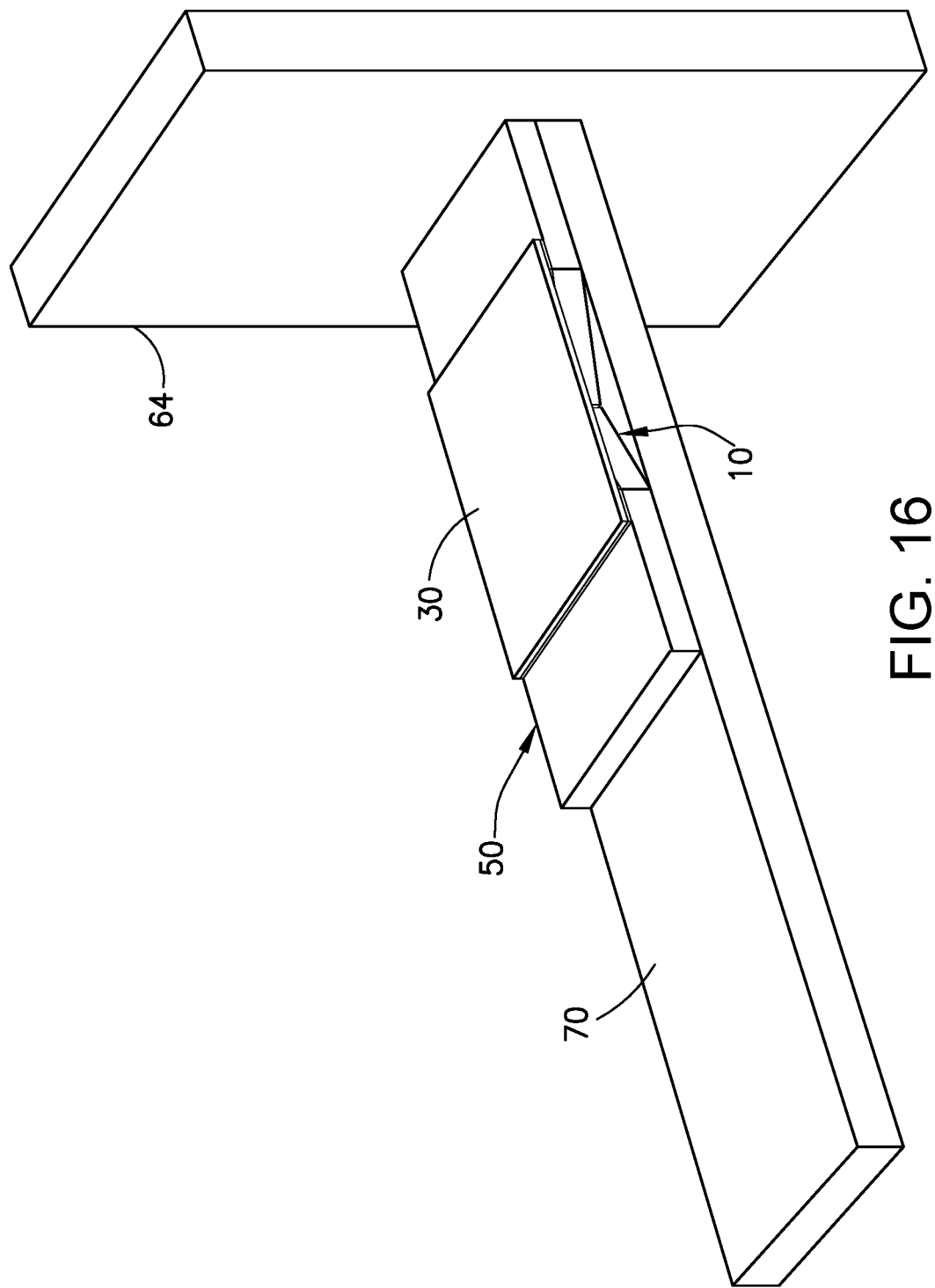
FIG. 16 is a diagram representing a 3-D view of a piezoelectric energy harvester having a meta-substrate booster attached to a host structure in the form of a cantilever beam.

In accordance with alternative embodiments, a meta-substrate 50 may be used as a booster which is bonded to a host structure in the form of a cantilever beam 70 made of material having positive Poisson's ratio, as depicted in FIG. 16. This booster can be utilized in situations where a cantilever beam has already been installed on a host structure 64 and substituting a cantilevered MPEH is either impracticable or suboptimal. In this situation, one may install the booster on the installed cantilever beam 70, and then the piezoelectric element 30 is attached on top of the meta-substrate cell 10. The booster generates more power (by up to a factor of 10) as compared to a conventional cantilevered PEH with a plain substrate or even without any substrate between the cantilever beam and piezoelectric element.

To validate the physical interpretation represented by Eq. (7), first finite element modeling was performed for a 3-D MPEH 48 having the structure depicted in FIG. 10. The performance of the proposed MPEH was validated using two experimental results of a conventional PEH and an auxetic piezoelectric energy harvester (APEH). As a case study, to demonstrate the significant power enhancement of the MPEH, an equivalent conventional PEH using a plain substrate was also modeled. Then, to prove the validity of the MPEH output, both simulated models were evaluated to experimental results of the conventional PEH. For this performance evaluation, material properties and design parameters were selected similar to the experimental test. To this end, the excitation frequency, modulus of elasticity of the thin layer of elastic glue, and amplitude sinusoidal strains selected for the simulation matched the values adopted in the experimental test.

Figure 17:
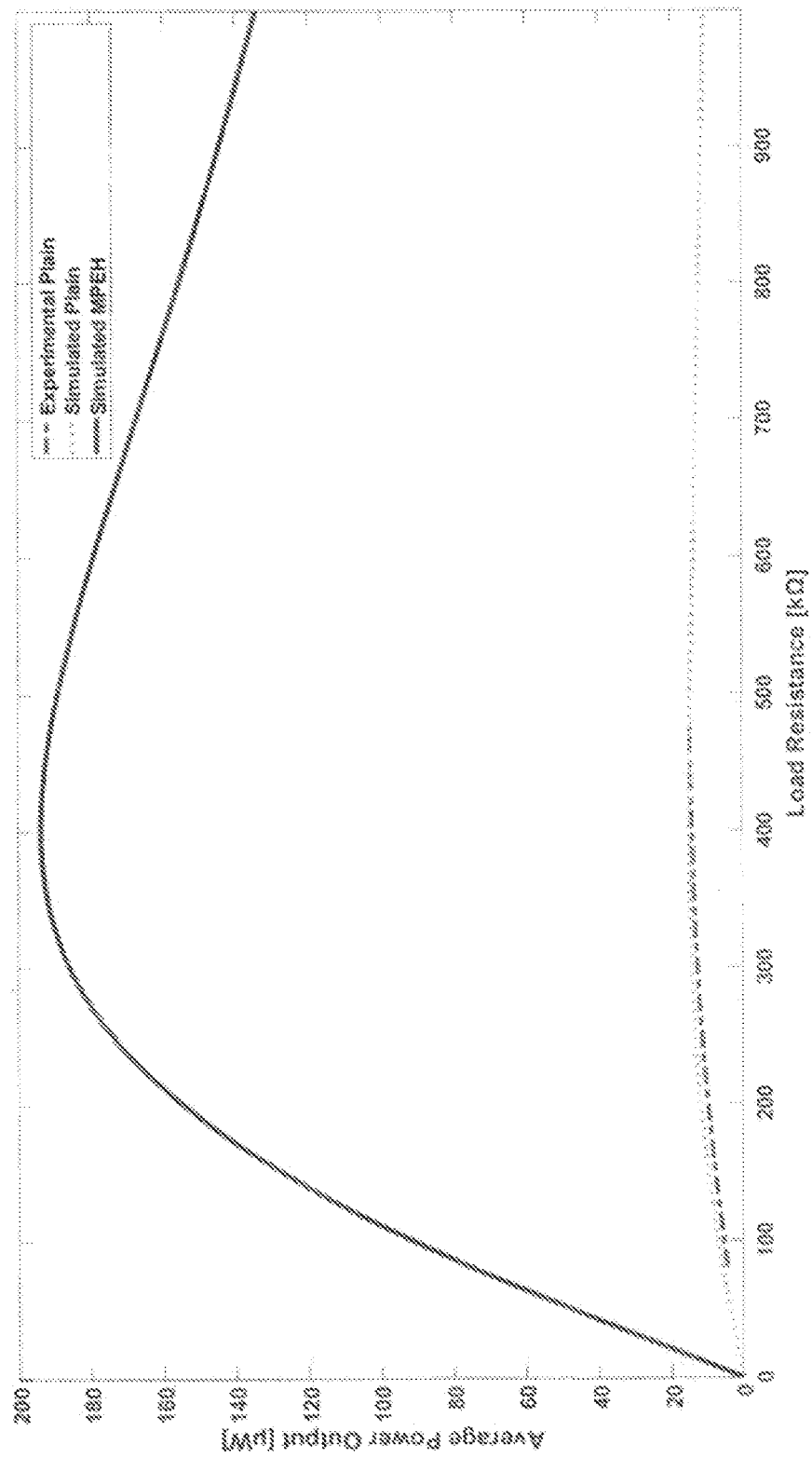
FIG. 17 is a graph of average power output versus load resistance derived from an experiment involving a plain-substrate piezoelectric energy harvester (dashed line), a simulation of a plain-substrate piezoelectric energy harvester (dotted line), and a simulation involving a meta-substrate piezoelectric energy harvester (solid line).

FIG. 17 is a graph of average power output versus load resistance derived from an experiment involving a plain-substrate piezoelectric energy harvester (dashed line), a simulation of a plain-substrate piezoelectric energy harvester (dotted line), and a simulation involving a meta-substrate piezoelectric energy harvester (solid line). As shown in FIG. 17, the average power output curve of the simulated model of a PEH with plain substrate was in a good agreement with the experimental results. At the electrical load resistance of 463 kΩ, the simulated PEH had an average power output of (14.8 μW) at the corresponding electrical load resistance. In contrast, the maximum power output of the simulated MPEH was 193.8 μW, which demonstrated a significantly enhanced power output compared to the conventional PEH with plain substrate.

The MPEHs proposed herein can improve strain-induced vibration applications in structural health monitoring systems, internet-of-things systems, micro-electromechanical systems, wireless sensor networks, vibration energy harvesters, and other applications where energy efficiency is dependent on deformation performance. For the sake of illustration, a wireless sensor network configured to acquire sensor data representing the state of components and parts of an aircraft will now be described. This sensor network includes a set of self-powered wireless sensor nodes installed at respective positions on the outside or inside the aircraft and a set of wireless routers capable of receiving sensor data in wireless signals transmitted by the set of self-powered wireless sensor nodes. The wireless sensors may include, for example, wireless passenger control units, brake temperature sensors, tire pressure sensors, light control switches, duct overheat sensors, aircraft health monitoring sensor, cabin temperature sensors, flight test instrumentation, door sensors, hatch sensors, cabin monitoring sensors, and other suitable types of sensors. Further, the sensor network includes one or more gateways connected to an aircraft data processing system. The gateway is capable of receiving sensor data in the wireless signals from the wireless routers and transmitting the received data into the aircraft network data processing system. This aircraft data processing system may be a line replaceable unit, such as, for example, a central server module, an electronic flight bag, a cabin services system, an environmental control system, an in-flight electronic entertainment system, a navigation system, a flight controller, a collision avoidance system, or some other suitable system. Depending on the particular implementation, the gateway may be directly connected to the aircraft data processing system. In other advantageous embodiments, the gateway may send the information to the aircraft data processing system across a network on which the data processing system is located. The data gathered by the wireless sensors may then be used by an aircraft data processing system perform various operations, such as maintaining cabin pressure, controlling control surfaces, and generating alerts.

Figure 18:
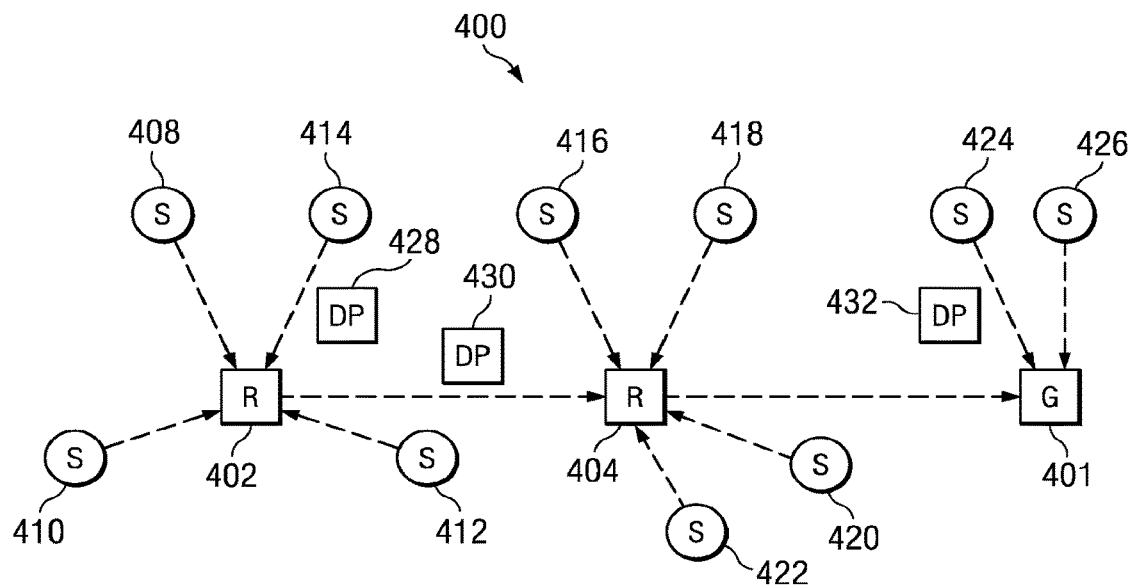
FIG. 18 is a diagram of a wireless sensor network in accordance with one embodiment.

FIG. 18 is a diagram of a wireless sensor network 400 in accordance with one embodiment. The wireless sensor network 400 includes a gateway 401, wireless routers 402 and wireless router 404, and self-powered wireless sensor nodes 408, 410, 412, 414, 416, 418, 420, 422, 424, and 426.

In the example depicted in FIG. 18, self-powered wireless sensor nodes 408, 410, 414, and 412 transmit wireless signals carrying sensor data to wireless router 402. In turn, wireless router 402 transmits signals containing the received data to wireless router 404. Wireless sensor nodes 416, 418, 420, and 422 transmit wireless signals carrying sensor to wireless router 404. Wireless router 404 sends this data in wireless signals to gateway 401. Further, wireless sensor nodes 424 and 426 directly send wireless signals to gateway 401. The different sensors may transmit data in the form of radiofrequency signals. In these examples, the data takes the form of data packets (DP), such as data packets 428, 430, and 432.

Further, gateway 406 may route the sensor data to the appropriate data processing system. In these examples, gateway 406 may also log data received from the sensor nodes with time stamps. Further, gateway 401 also may transmit an activity log to maintenance, operations, security, or other support personnel through an onboard or offboard system.

Wireless routers 402 and 404 make take various forms. For example, wireless routers 402 and 404 may be a simple computer that simply repeats data packets received from wireless sensor nodes. In other advantageous embodiments, these routers may be a mesh network router, such as, for example, an XBee ZNet 2.5 RF Module, which is available from Digi International, Inc. Gateway 401 may be, for example, be implemented as a ConnectPort X8, which is available from Digi International, Inc.

Figure 19:
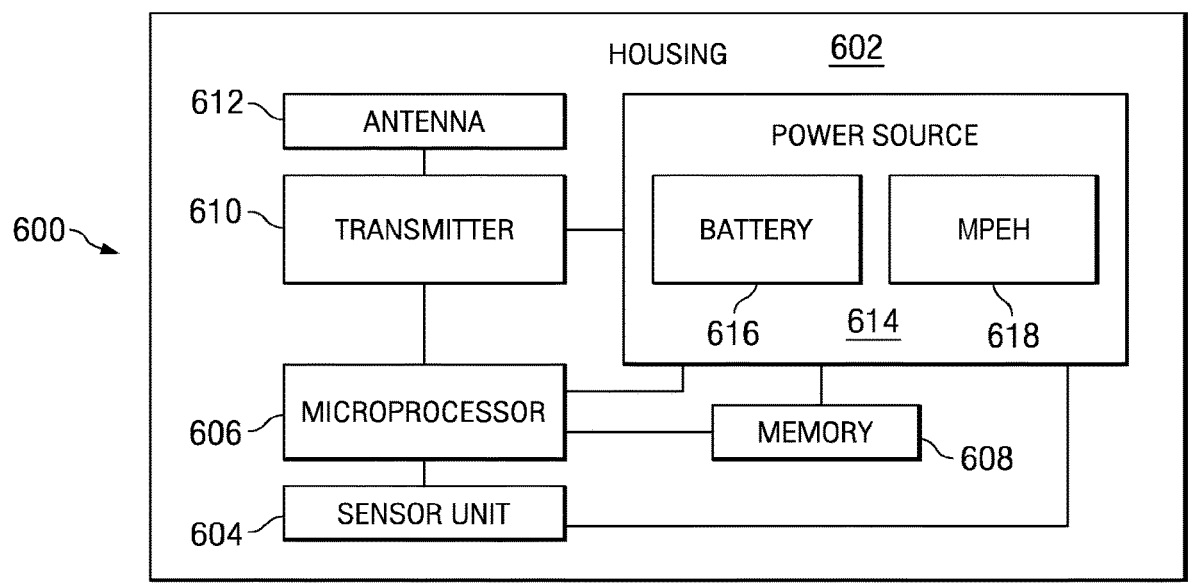
FIG. 19 is a block diagram of a self-powered wireless sensor node in accordance with one embodiment.

FIG. 19 is a block diagram of a self-powered wireless sensor node 600 in accordance with one embodiment. In this example, self-powered wireless sensor node 600 includes a housing 602, which contains a sensor unit 604, a microprocessor 606, a memory 608, a transmitter 610, an antenna 612, and a power source 614. Sensor unit 604 may contain a set of sensors.

Data may be temporarily stored in memory 608 until transmitted by transmitter 610 over antenna 612. In this example, transmitter 610 transmits wireless signals over antenna 612 in the form of radiofrequency signals. Further, transmitter 610 is associated with a unique identification number that is included with a transmitted data packet to allow a gateway to distinguish between different sensor nodes and identify sensor locations. Microprocessor 606 controls the sampling or receipt of data from sensor unit 604. Microprocessor 606 may be configured to obtain and transmit data from sensor unit 604 based on an event. These events may be periodic or not periodic. For example, the periodic event may be a schedule in which cabin air temperature is sensed every ten seconds. In other advantageous embodiments, data may be sensed by an external event, such as the physical opening of a door. Sensor unit 604 may take various forms. For example, without limitation, sensor unit 604 may be a temperature sensor, a switch that is associated with a door or other portal, a biometric unit, an airflow detector, or some other suitable transducer or sensor device. The power source 614 provides power to transmitter 610, microprocessor 606, memory 608, and sensor unit 604 for the various operations.

In accordance with the proposed implementation depicted in FIG. 19, the power source 614 includes a battery 616 and an MPEH 618 of one of the types described above. The MPEH 618 may provide power when various conditions are present. The battery 616 may provide electric power to supplement or substitute for electric power provided by MPEH 618. Further, MPEH 618 may charge battery 616. In some applications, a capacitor or a super-capacitor may be used in lieu of battery 616 to provide power to the various components. This capacitor or super-capacitor may be used in conjunction with MPEH 618.

Figure 20:
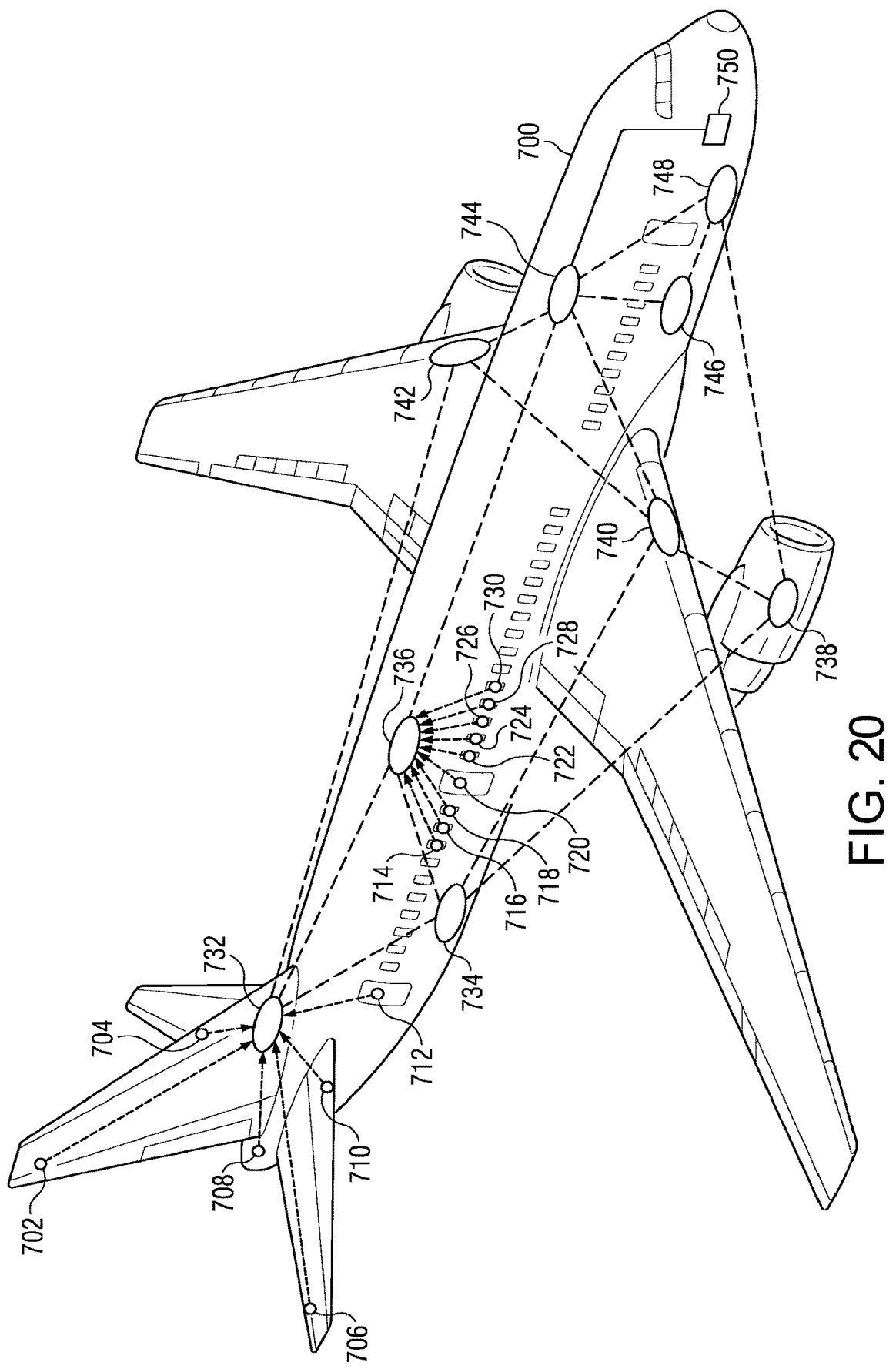
FIG. 20 is a diagram illustrating a wireless sensor network layout for an aircraft in accordance with one embodiment.

FIG. 20 is a diagram illustrating a wireless sensor network layout for an aircraft 700 in accordance with one embodiment. In this example, the aircraft 700 includes self-powered wireless sensor nodes 702, 704, 706, 708, 710, 712, 714, 716, 718, 720, 722, 724, 726, 728, and 730. The sensor network also includes wireless routers 732, 734, 736, 738, 740, 742, 744, 746, and 748. This sensor network also includes gateway 750. As depicted in FIG. 20, the different wireless sensors may be located inside and outside of the aircraft. Wireless sensor nodes 702, 704, 706, 708, 710, and 712 are located on the exterior of aircraft 700; wireless sensor nodes 714, 716, 718, 720, 722, 724, 726, 728, and 730 are located on the interior of the aircraft.

The wireless routers may be located on the interior or exterior of the aircraft depending on the particular implementation. In the example depicted in FIG. 20, wireless routers 732, 738, 740, 742 and 748 are located on the exterior of aircraft 700. Wireless routers 734, 736, 744, and 746 are located inside the aircraft. Also, in these examples, gateway 750 is located inside the aircraft 700. Interior locations may include, for example, passenger cabin, cabin ceiling areas, cargo holds, and electrical equipment centers. Exterior locations may include, for example, landing gear wheel wells, engine struts, and within the empennage. Also, both wireless and wired connections may be provided from a router sending data directly to gateway 750. Multiple routers may send data to gateway 750 to provide redundancy.

Figure 21:
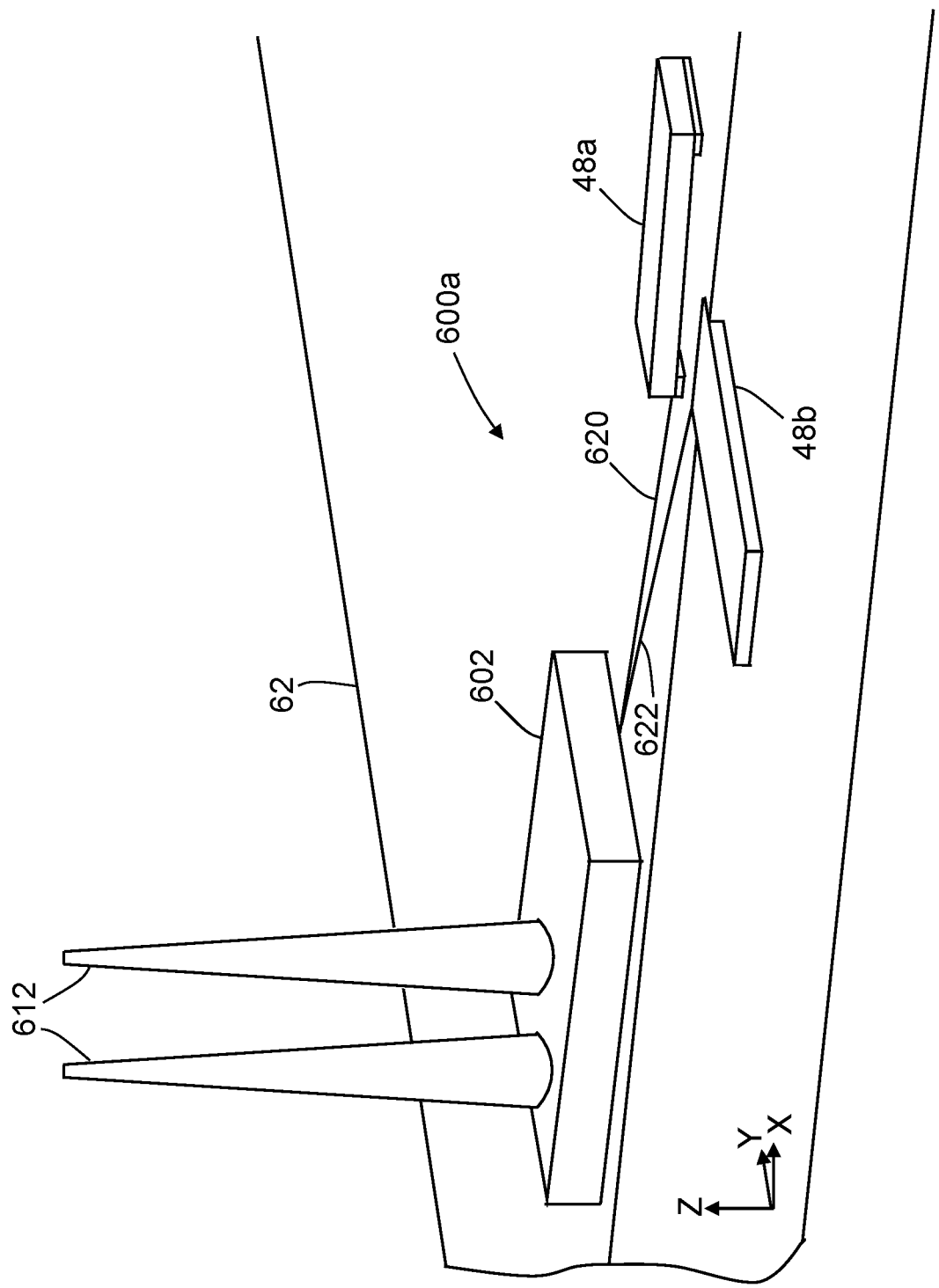
FIG. 21 is a diagram representing a 3-D view of a sensor node in accordance with one embodiment.

FIG. 21 is a diagram representing a 3-D view of a self-powered wireless sensor node 600a in accordance with one example having two MPEHs. Any number of MPEHs may be mounted to the host structure 62, including one or more of the MPEHs depicted in FIGS. 7 through 16. The self-powered wireless sensor node 600a depicted in FIG. 21 includes a bridging MPEH 48a (as depicted in FIG. 12) and a cantilever MPEH 48b (as depicted in FIG. 13) mounted to a host structure 62. The bridging MPEH 48a supplies electric power to the electrical components inside housing 602 by an electrical cable 620. The cantilever MPEH 48b supplies electric power to the electrical components inside housing 602 by an electrical cable 622. In alternative sensor node embodiments, one or more MPEHs of the types shown in FIGS. 7 through 16 may be attached to host structure 62 and connected to electrical components inside housing 602 by respective electrical cables.

Figure 22:
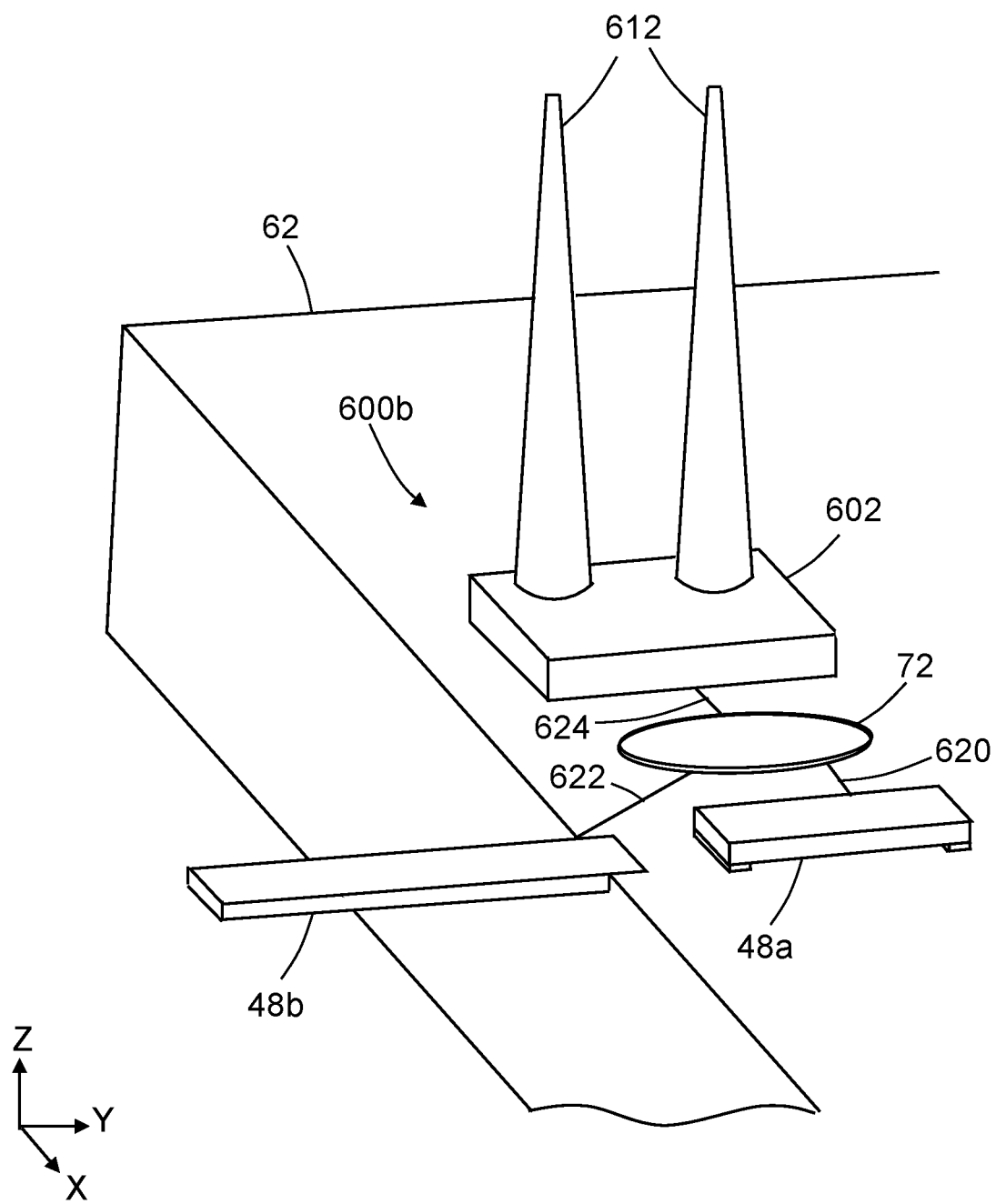
FIG. 22 is a diagram representing a 3-D view of a sensor node having a supercapacitor for storing electric energy generated by a meta-substrate piezoelectric energy harvester.

FIG. 22 is a diagram representing a 3-D view of a self-powered wireless sensor node 600b in accordance with another example having two MPEHs. Any number of MPEHs may be mounted to the host structure 62, including one or more of the MPEHs depicted in FIGS. 7 through 16. The self-powered wireless sensor node 600b depicted in FIG. 22 includes a strain type of bridging MPEH 48a mounted to host structure 62, a cantilever MPEH 48b mounted to host structure 64, and a super-capacitor 72. The bridging MPEH 48a supplies electric power to super-capacitor 72 by electrical cable 620. The cantilever MPEH 48b supplies electric power to super-capacitor 72 by electrical cable 622. The super-capacitor 72 supplies electric power to the electrical components inside housing 602 by an electrical cable 624. In alternative embodiments, one or more MPEHs of the types shown in FIGS. 7 through 16 may be attached to host structure 62 and connected to super-capacitor 72 by electrical cables.

The MPEHs disclosed herein generate power at low excitation frequency and generates more power at high excitation frequency. This enables the microprocessor 606 of the sensor node to make real-time decisions in emergency cases (due to its enhancement in power generation). The sensor nodes may be installed on aircraft wings and stabilizers or any other part of aircraft which is subject to vibration and needs to be monitored either during or after a flight. An operator onboard the aircraft can monitor the sensor data using a network server. The network server manages the network, filters redundant data packets, performs security checks, and implements an adaptive data rate. The network server transmits the data packets to an application server to handle the customer application.

In accordance with one proposed implementation, a SHM system includes an IoT platform configured to intelligently process the sensor data acquired from an aircraft. A sufficient and sustainable supply of harvested energy can feed the self-powered wireless sensor nodes not only to increase their transmission range, but also to decrease implementation costs as well as decision-making time. Hence, the more the energy is harvested, the more improved the IoT network's performance will be. This disclosure introduces a high-performance IoT-based SHM system for monitoring the state of an aircraft's body in which MPEHs act as a sufficient and sustainable supply of electric power for feeding wireless sensor nodes. The IoT platform is used to gather and analyze data collected by wireless sensors. More specifically, a long-range wide area network is designed to transfer the sensors' data in a low-power manner. The energy supply required for the data transfer is directly charged by different types of MPEHs (e.g., cantilevered and bridging).

While piezoelectric energy harvesters having a meta-substrate coupled to a piezoelectric element and wireless sensor networks having sensor nodes powered by such piezoelectric energy harvesters have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore, it is intended that the claims not be limited to the particular embodiments disclosed herein.

As used in the claims, the term "coupled" should be construed broadly to include both glued and integrally formed. For example, an MPEH may be coupled to a host structure by gluing the meta-substrate cell to the host structure or by integrally forming the meta-substrate cell with the host structure using the same manufacturing process.

The invention claimed is:

1. A vehicle comprising:
a host structure that vibrates during movement of the vehicle;
an energy harvesting device that is coupled to the host structure and configured to convert vibrations to electric power; and
an electrical device mounted to the host structure and connected to receive electric power that was generated by the energy harvesting device,
wherein the energy harvesting device comprises:
a first meta-material substrate comprising an auxetic frame having first and second kirigami cuts and a negative Poisson's ratio, wherein:
the auxetic frame comprises first and second walls and first and second flexible structures which connect the first wall to the second wall;
the first flexible structure comprises a first flexural element integrally connected to the first wall by a first flexural hinge and a second flexural element integrally connected to the second wall by a second flexural hinge;
the second flexible structure comprises a third flexural element integrally connected to the first wall by a third flexural hinge and a fourth flexural element integrally connected to the second wall by a fourth flexural hinge;
the first and second flexural elements form the first kirigami cut when the first flexible structure is in an unflexed state and are connected to each other by a fifth flexural hinge that is a part of the first flexible structure which closes a closed end of the first kirigami cut; and
the third and fourth flexural elements form the second kirigami cut when the second flexible structure is in an unflexed state and are connected to each other by a sixth flexural hinge that is a part of the second flexible structure which closes a closed end of the second kirigami cut;
a first layer of elastic glue adhered to a first surface of the auxetic frame; and
a first piezoelectric element adhered to the first layer of elastic glue.

2. The vehicle as recited in 1, wherein the electrical device comprises a sensor unit, a transmitter, a microprocessor, and memory which receive electric power from the energy harvesting device.

3. The vehicle as recited in 1, further comprising a supercapacitor that is charged by the energy harvesting device and supplies electric power to the electrical device.

4. The vehicle as recited in 1, further comprising a battery that is charged by the energy harvesting device and supplies electric power to the electrical device.

5. The vehicle as recited in claim 1, wherein the negative Poisson's ratio of the auxetic frame is evidenced, when the first and second flexible structures are in the unflexed states, by an increase in a size of a gap which separates the fifth and sixth flexural hinges in response to flexures of the first and second flexible structures that concurrently increase a first distance separating the first flexural hinge from the second flexural hinge and a second distance separating the third flexural hinge from the fourth flexural hinge.

6. The vehicle as recited in claim 1, wherein the first and second kirigami cuts are uniaxial when the first and second flexible structures are in their unflexed states.

7. The vehicle as recited in claim 1, wherein the fifth and sixth flexural hinges are separated by a gap that increases in size as the first and second walls move away from each other.

8. The vehicle as recited in claim 1, wherein the first and second walls are plate-shaped and the first through fourth flexural elements are trapezoidal in a top view.

9. The vehicle as recited in claim 1, further comprising a second meta-material substrate comprising an auxetic frame having third and fourth kirigami cuts and a negative Poisson's ratio, wherein the first and second meta-material substrates are connected in series.

10. The vehicle as recited in claim 1, wherein the first meta-material substrate is configured as a cantilever beam having one end attached to a host structure while another end is unconstrained.

11. The vehicle as recited in claim 1, wherein the first and second kirigami cuts have respective open ends which widen as the first and second walls move away from each other.

12. A sensor network in an aircraft for collecting data about the aircraft, the sensor network comprising:
a wireless router attached to the aircraft; and
a self-powered sensor node attached to a structural part of the aircraft and wirelessly communicatively coupled to the wireless router,
wherein the self-powered sensor node comprises a sensor unit configured to sense a condition or property of the structural part in a detection zone, a transmitter configured to transmit sensor data signals that carry information indicating the sensed condition or property, and an energy harvesting device that is coupled to the structural part of the aircraft and configured to convert vibrations to electric power; and
wherein the energy harvesting device comprises a meta-material substrate that is coupled to the structural part and comprises an auxetic frame having first and second kirigami cuts, a layer of elastic glue adhered to the auxetic frame, and a piezoelectric element adhered to the layer of elastic glue, wherein:
the auxetic frame comprises first and second walls and first and second flexible structures which connect the first wall to the second wall;
the first flexible structure comprises a first flexural element integrally connected to the first wall by a first flexural hinge and a second flexural element integrally connected to the second wall by a second flexural hinge;
the second flexible structure comprises a third flexural element integrally connected to the first wall by a third flexural hinge and a fourth flexural element integrally connected to the second wall by a fourth flexural hinge;
the first and second flexural elements form the first kirigami cut when the first flexible structure is in an unflexed state and are connected to each other by a fifth flexural hinge that is a part of the first flexible structure which closes a closed end of the first kirigami cut; and the third and fourth flexural elements form the second kirigami cut when the second flexible structure is in an unflexed state and are connected to each other by a sixth flexural hinge that is a part of the second flexible structure which closes a closed end of the second kirigami cut.

13. The sensor network as recited in claim 12, wherein the first and second walls are plate-shaped and the first through fourth flexural elements are trapezoidal in a top view.

14. The sensor network as recited in claim 12, wherein the first through fourth flexural elements bend at the first through fourth flexural hinges respectively as the first and second walls move away from each other.

15. The vehicle as recited in claim 7, wherein the gap is part of an opening having a concave polygonal shape defined by six straight line segments.

16. The vehicle as recited in claim 7, wherein the first through fourth flexural elements bend at the first through fourth flexural hinges respectively as the first and second walls move away from each other.

17. The sensor network as recited in claim 12, wherein the negative Poisson's ratio of the auxetic frame is evidenced, when the first and second flexible structures are in the unflexed states, by an increase in a size of a gap which separates the fifth and sixth flexural hinges in response to flexures of the first and second flexible structures that concurrently increase a first distance separating the first flexural hinge from the second flexural hinge and a second distance separating the third flexural hinge from the fourth flexural hinge.

18. The sensor network as recited in claim 17, wherein the gap is part of an opening having a concave polygonal shape defined by six straight line segments.

19. A method for energy harvesting in a vehicle that is moving, comprising:
coupling a meta-material substrate to a host structure that vibrates during movement of the vehicle;
coupling a piezoelectric element to the meta-material substrate;
connecting the piezoelectric element to an electrical device that is a component of the vehicle;
causing the vehicle to move in a manner that produces strain waves in the host structure;
amplifying the strain waves produced in the host structure using the meta-material substrate;
converting the amplified strain waves into electrical power using the piezoelectric element; and
supplying the electrical power to the electrical device,
wherein the meta-material substrate comprises an auxetic frame having first and second kirigami cuts and a negative Poisson's ratio, wherein the auxetic frame comprises:
first and second walls and first and second flexible structures which connect the first wall to the second wall, wherein:
the first flexible structure comprises a first flexural element integrally connected to the first wall by a first flexural hinge and a second flexural element integrally connected to the second wall by a second flexural hinge;
the second flexible structure comprises a third flexural element integrally connected to the first wall by a third flexural hinge and a fourth flexural element integrally connected to the second wall by a fourth flexural hinge;
the first and second flexural elements form the first kirigami cut when the first flexible structure is in an unflexed state and are connected to each other by a fifth flexural hinge that is a part of the first flexible structure which closes a closed end of the first kirigami cut; and
the third and fourth flexural elements form the second kirigami cut when the second flexible structure is in an unflexed state and are connected to each other by a sixth flexural hinge that is a part of the second flexible structure which closes a closed end of the second kirigami cut, and
wherein amplifying the strain waves comprises expanding the auxetic frame in both longitudinal and transverse directions concurrently.

20. The method as recited in claim 19, wherein during amplifying the strain waves, the negative Poisson's ratio of the auxetic frame enables a gap which separates the fifth and sixth flexural hinges when the first and second flexible structures are in the unflexed states to increase in size in response to flexure of the first and second flexible structures that results in concurrent increases in a first distance separating the first flexural hinge from the second flexural hinge and a second distance separating the third flexural hinge from the fourth flexural hinge.

* * * * *